US012686270B2

(12) United States Patent (10) Patent No.: US 12,686,270 B2
Son (45) Date of Patent: *Jul. 21, 2026

(54) DISPLAY APPARATUS AND TRANSPORTATION APPARATUS

(71) Applicant: LG Display Co., Ltd., Seoul (KR)

(72) Inventor: SungSik Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 129 days.

This patent is subject to a terminal disclaimer.

(21) Appl. No.: 18/741,217

(22) Filed: Jun. 12, 2024

(65) Prior Publication Data

US 2025/0040064 A1      Jan. 30, 2025

(30) Foreign Application Priority Data

Jul. 28, 2023    (KR) ........................ 10-2023-0098987

(51) Int. Cl.
*B60K 35/22* (2024.01)
*H05K 5/02* (2006.01)
*H10K 59/60* (2023.01)
*H10K 59/80* (2023.01)

(52) U.S. Cl.
CPC .............. *B60K 35/22* (2024.01); *H05K 5/02* (2013.01); *H10K 59/60* (2023.02); *H10K 59/87* (2023.02); *B60K 2360/21* (2024.01)

(58) Field of Classification Search
CPC ............................ B60K 35/22; B60K 2360/21
See application file for complete search history.

(56) References Cited

U.S. PATENT DOCUMENTS

| | | | | |
|---|---|---|---|---|
| 2008/0211652 | A1* | 9/2008 | Cope | B60K 35/10 |
| | | | | 340/461 |
| 2020/0298900 | A1* | 9/2020 | Palm | B62D 1/18 |
| 2022/0052142 | A1* | 2/2022 | Kim | H10K 59/121 |
| 2022/0171120 | A1* | 6/2022 | Cai | G02F 1/133608 |
| 2022/0345597 | A1* | 10/2022 | Yew | B60K 35/22 |
| 2025/0040402 | A1* | 1/2025 | Son | B60K 35/22 |

FOREIGN PATENT DOCUMENTS

| | | | |
|---|---|---|---|
| CN | 109902664 A | * | 6/2019 |
| CN | 210155456 U | * | 3/2020 |
| CN | 210155680 U | * | 3/2020 |
| CN | 210402377 U | * | 4/2020 |

* cited by examiner

*Primary Examiner* — Keith G. Delahoussaye
(74) *Attorney, Agent, or Firm* — Fenwick & West LLP

(57) ABSTRACT

A display apparatus includes a display panel configured to display an image; a front member on a front surface of the display panel; a support member on a rear surface of the display panel; an optical module on the rear surface of the first support member; and a support body on a portion of the rear surface of the support member and supporting the optical module.

30 Claims, 16 Drawing Sheets

200

200

710 (710a, 710b, 710c)

720 (720a, 720b)

710 (710a, 710b, 710c)

720 (720a, 720b)

710 (710a, 710b, 710c)

720 (720a, 720b)

710 (710a, 710b, 710ae, 710be)

720 (720a, 720b)

DISPLAY APPARATUS AND TRANSPORTATION APPARATUS

CROSS-REFERENCE TO RELATED APPLICATION

This application claims priority from Republic of Korea Patent Application No. 10-2023-0098987, filed on Jul. 28, 2023, which is hereby incorporated by reference in its entirety.

BACKGROUND

Field

Embodiments of the present disclosure relate to a display apparatus and a transportation apparatus including the display apparatus.

Description of Related Art

As technology advances, display apparatuses may be applied not only to smartphones, laptops, and the like, but also to transportation apparatuses, including automobiles.

Display apparatuses that are widely used may provide, in addition to image display functions, image capturing functions and various sensing functions. For this purpose, display apparatuses are equipped with optical modules such as cameras and sensors.

Accordingly, an optical module is disposed at the edge of the display panel of a display apparatus in order to include the optical module in the display apparatus, and thus the display apparatus including the optical module has a problem in that has to be large in size due to the physical size of the optical module. For this reason, there have been significant limitations in designing display apparatuses for use in various applications.

SUMMARY

An object to be achieved by an embodiment of the present disclosure is to provide a display apparatus in which the width of the non-display area of a display panel may be reduced by disposing an optical module that overlaps the display panel.

Another object to be achieved by an embodiment of the present disclosure is to provide a display apparatus in which an optical module is stably coupled by disposing a structure to which the optical module is coupled.

Objects of the present disclosure are not limited to the problems mentioned above, and other problems not mentioned above will be clearly understood by those skilled in the art from the following description.

A display apparatus comprising: a display panel configured to display an image; a front member on a front surface of the display panel; a support member on a rear surface of the display panel that is opposite the front surface of the display panel; an optical module on the rear surface of the support member; and a support body on a portion of the rear surface of the support member and protrudes from the rear surface of the support member, the support body supporting the optical module.

In one embodiment, a display apparatus comprises: a display panel configured to display an image in a display area of the display panel, the display panel including a hole through a thickness of the display panel in the display area; a support member on a rear surface of the display panel, the support member including a hole through a thickness of the support member and the hole aligned with the hole in the display panel; an optical device on a rear surface of the support member, the optical device including a portion that is disposed within the hole of the support member; and a support body that protrudes from a portion of the rear surface of the support member, the support body surrounding a plurality of surfaces of the optical device that are not disposed within the hole of the support member.

According to the present disclosure, there is provided a display apparatus having a hole formed in a display panel and including an optical module-supporting structure around the hole formed in the display panel. As the optical module-supporting structure is disposed around the hole formed in the display panel and the optical module is coupled to the optical module-supporting structure around the hole formed in the display panel, the optical module may be formed to overlap the display panel. Accordingly, the non-display area (or bezel area) of the display panel may be reduced in size.

According to the present disclosure, there may be provided a display apparatus in which an optical module is stably coupled by disposing a structure to which the optical module is coupled.

According to the present disclosure, the fastening structure for fastening the optical module (e.g., a light-receiving device such as a camera, a sensor, etc.) to the display apparatus may be unified (integrated) with the support structure for supporting the rear surface of the display panel, thereby simplifying the structure of the display apparatus and reducing the number of components. Accordingly, it is possible to provide a display apparatus capable of process optimization and weight reduction, and the effect of uni-materialization is obtained.

Effects of the present disclosure are not limited to the effects mentioned above, and other effects not mentioned above will be clearly understood by those skilled in the art from the following description.

DETAILED DESCRIPTION

Figure 1:
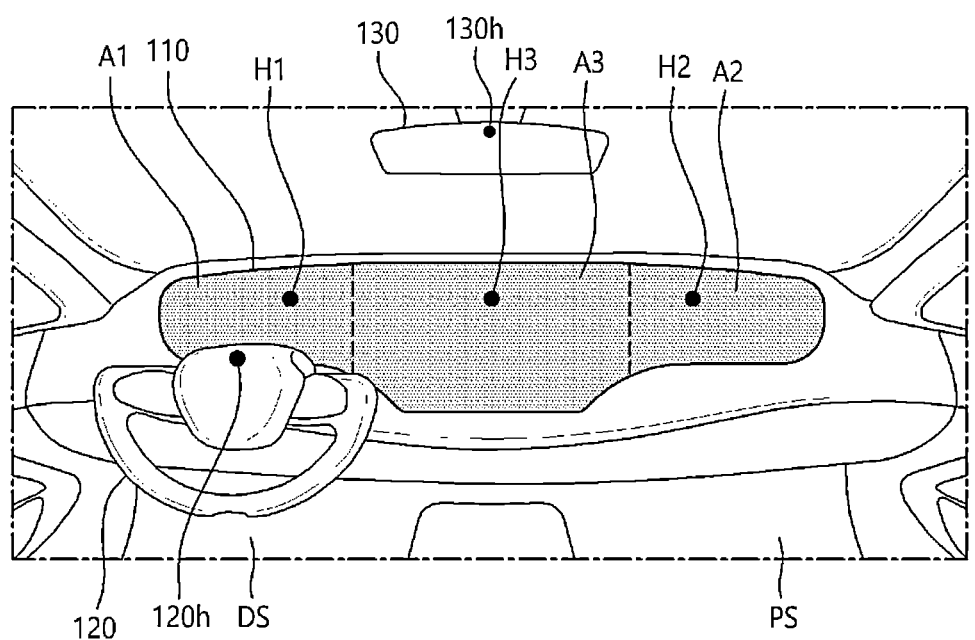
FIG. 1 shows the interior space of a transportation apparatus according to one embodiment of the present disclosure.

Advantages and features of the present disclosure, and implementation methods thereof will be clarified through the following embodiments described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

In addition, the shapes, sizes, ratios, angles, numbers, and the like illustrated in the drawings for describing embodiments of the present disclosure are merely examples, and thus the present disclosure is not limited thereto. Like reference numerals refer to like elements throughout the specification. In the following description, when the detailed description of the relevant known technology is determined to unnecessarily obscure the subject matter of the present disclosure, the detailed description will be omitted.

The terms, such as "including," "having," "containing," "composed of," "comprising," or the like, used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes include a tolerance or error range even when a specific description is not conducted.

Spatially relative terms, such as "on," "over," "above," "below," "under," "beneath," "lower," "upper," "near," "close," "adjacent," or the like, used herein to describe one element or feature's relationship to another element(s) or feature(s) are generally intended to allow one or more additional elements to be interposed between the elements unless the terms, such as "directly," "immediately," or the like, are used.

When the terms, such as "first," "second," or the like, are used herein to describe various elements or components, it should be considered that these elements or components are not limited by these terms. These terms are merely used herein for distinguishing an element from other elements. Therefore, a first element mentioned below may be a second element in a technical concept of the present disclosure.

Like reference numerals refer to like elements throughout the specification.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

The term "display apparatus" as used herein may include a display apparatus in a narrow sense, such as a liquid crystal module (LCM), an organic light emitting display module (OLED Module), a quantum dot module, or the like, which includes a display panel and a driver for driving the display panel. The term "display apparatus" may also include a notebook computer, a television, a computer monitor, equipment displays, including an automotive display or other displays for vehicles, a set electronic apparatus or a set device or set apparatus such as a mobile electronic apparatus, e.g., a smartphone, an electronic pad, etc., which are complete products or final products including the LCM, the OLED module, the QD module, or the like.

Accordingly, the term "display apparatus" as used herein may include a display apparatus itself in a narrow sense, an application product including a display apparatus in a narrow sense, or even a set apparatus that is an apparatus for end consumers. Hereinafter, embodiments of the present disclosure will be described in detail with reference to the accompanying drawings.

FIG. 1 shows the interior space of a transportation apparatus according to one embodiment of the present disclosure.

The transportation device according to an embodiment of the present disclosure may include a vehicle, etc., but embodiments of the present disclosure are not limited thereto. The present disclosure will be described by way of example of a vehicle.

Referring to FIG. 1, the interior space 100 may include a driver's seat DS, a passenger seat PS, a dashboard 110, a steering wheel (handle) 120, and a rearview mirror 130.

The dashboard 110 may include a first area A1 corresponding to the driver's seat (DS) space, a second area A2 corresponding to the passenger seat (PS) space, and a third area A3 corresponding to a space between the driver's seat DS and the passenger seat PS. Each area of the dashboard 110 may include at least one display apparatus 200 shown in FIG. 4. For example, the display apparatus 200 may be installed in the dashboard 110 of the transportation apparatus. The display apparatus 200 installed in the dashboard 110 may provide driving and other information to each of the driver and passenger.

Accordingly, the areas of the dashboard 110 may have different sizes. As the areas of the dashboard 110 have different sizes, a user of the transportation apparatus may optimally use the transportation apparatus. The first area A1 and second area A2 of the dashboard 110 may be smaller than the third area A3 of the dashboard 110. The display apparatus 200 installed in the dashboard 110 may have a curved outer portion. The dashboard 110 may have a T-shape. When the dashboard 110 has a T-shape, a user sitting in the back seat of the transportation apparatus may better see the display apparatus 200 of the dashboard 110.

The display apparatus 200 corresponding to each area of the dashboard 110 may have a hole therein. The display apparatus 200 may include an optical module. The hole in the display apparatus 200 may serve as a path through which an optical module disposed on the rear surface of the display apparatus 200 emits or receives light. The dashboard 110 may include a first hole H1 in the first area A1, a second hole H2 in a second area A2 different from the first area A1, and a third hole H3 in a third area A3 between the first area A1 and the second area A2.

In addition to the dashboard 110, the steering handle 120 and the rearview mirror 130 may have a handle hole 120*h* and a rearview mirror hole 130*h*, respectively.

The display apparatus 200 installed in the dashboard 110 may include a cluster, which corresponds to the driver's seat DS and displays various instruments necessary for driving, and a center fascia and a center information display (CID), which are located between the areas corresponding to the driver's seat DS and the passenger seat PS and provide various information to the driver and passenger, but embodiments of the present disclosure are not limited thereto.

Figure 2:
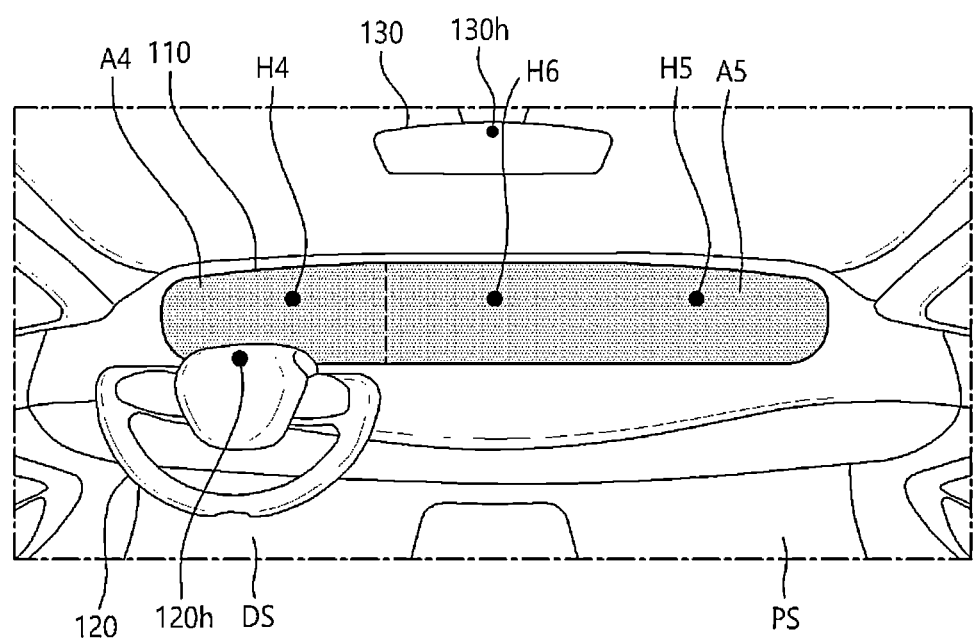
FIG. 2 shows the interior space of a transportation apparatus according to another embodiment of the present disclosure.

FIG. 2 shows the interior space of a transportation apparatus according to another embodiment of the present disclosure.

Referring to FIG. 2, a dashboard 110 may include a fourth area A4 corresponding to a driver's seat (DS) space, and a fifth area A5 corresponding to a space between the driver's seat DS and the passenger seat PS and to a passenger seat (PS) space. The fourth area A4 may be smaller than the fifth area A5.

A display apparatus 200 (see FIG. 4) corresponding to the fifth area A5 may have a fifth hole H5 and a sixth hole H6. For example, the display apparatus 200 may have one or more holes. If the display apparatus 200 has one or more holes, a single display apparatus 200 may be used by a plurality of users of the transportation apparatus, and thus the display apparatus 200 may be manufactured with a large area. In one embodiment, the dashboard 110 may include a single display apparatus 200 corresponding to both the driver space and the passenger space. For example, the display apparatus 200 may be disposed integrally in the dashboard 110 without distinction between the fourth area A4 and the fifth area A5.

Figure 3:
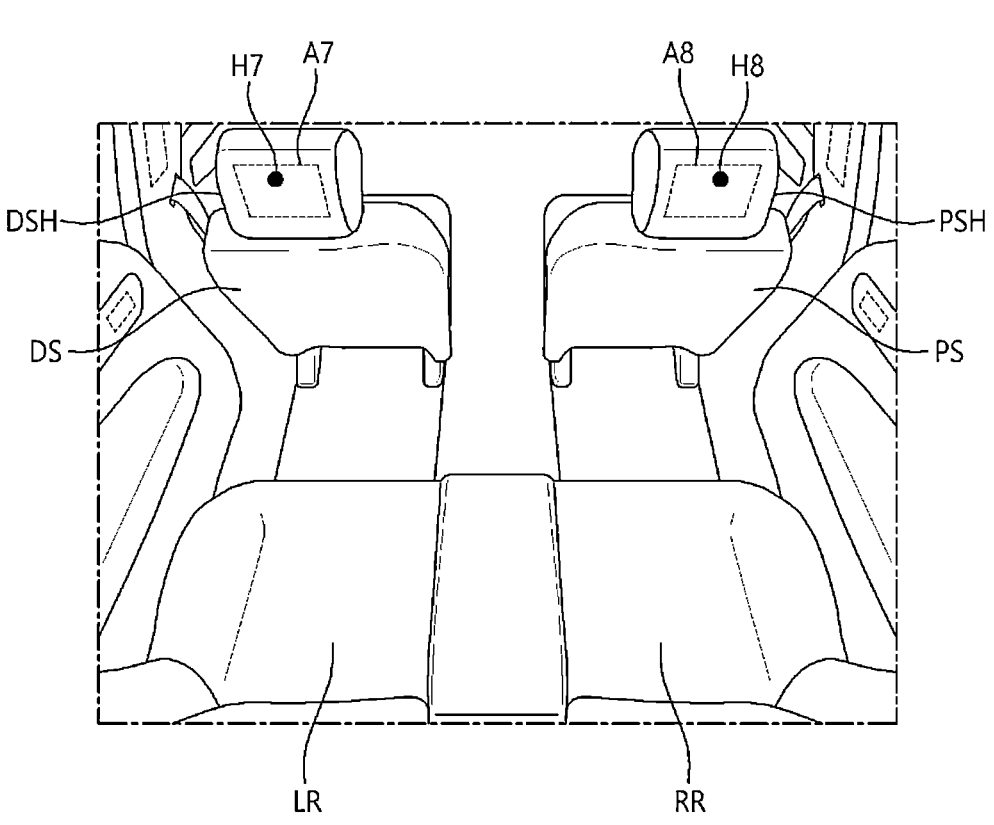
FIG. 3 shows the interior space of a transportation apparatus according to still another embodiment of the present disclosure.

FIG. 3 shows the interior space of a transportation apparatus according to still another embodiment of the present disclosure.

Referring to FIG. 3, the interior space 100 of the transportation apparatus may include a seventh area A7 corresponding to the rear of the headrest DSH of a driver's seat DS, and an eighth area A8 corresponding to the rear of the headrest PSH of a passenger seat PS. A display apparatus 200 (see FIG. 4) corresponding to the seventh area A7 may have a seventh hole H7, and a display apparatus 200 (see FIG. 4) corresponding to the eighth area A8 may have an eighth hole H8. The display apparatus 200 corresponding to the seventh area A7 or the eighth area A8 may provide various information to a user sitting in a left rear seat LR or a right rear seat RR.

The embodiments described above are not limited to what is disclosed in the present disclosure. For example, although FIG. 3 shows each of the display apparatus 200, which includes the seventh hole H7 and corresponds to the seventh area A7, and the display apparatus 200, which includes the eighth hole H8 and corresponds to the eighth area A8, it is possible to contemplate a single display apparatus 200 that includes both the seventh area A7 corresponding to the rear of the driver's seat DS and the eighth area A8 corresponding to the rear of the passenger seat PS.

Figure 4:
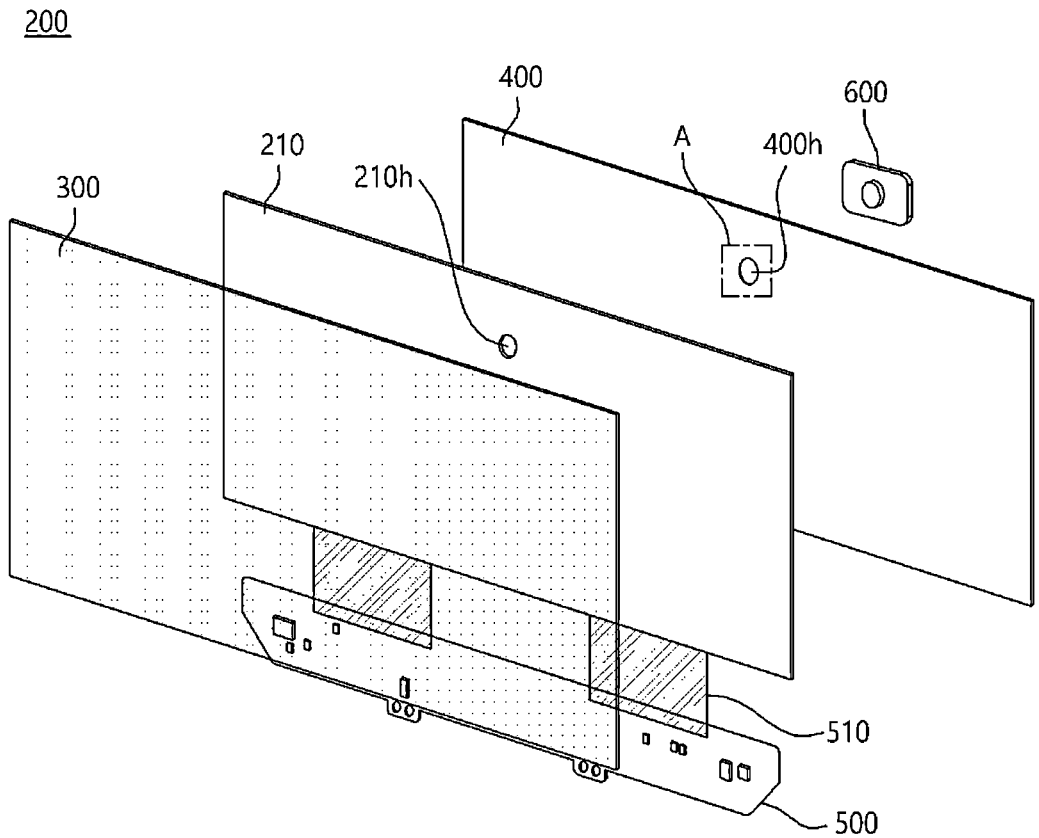
FIG. 4 is an exploded perspective view of a display apparatus according to an embodiment of the present disclosure.

Each of the first to eighth holes H1 to H8 may be an area through which an optical module is fastened to the lower portion of a display panel 210 shown in FIG. 4. The optical module will be described later with reference to FIG. 4. The first to eighth holes H1 to H8 may have the same size and shape, or at least one of the size and shape may be different therebetween. For example, the first to eighth holes H1 to H8 may have the same or substantially the same fastening structure by which the optical module is fixed (fastened) to the lower portion of the display panel 210. In the following description, the optical module-fastening structure related to the first hole H1 will be described by way of example of the first hole H1 among the first to eighth holes H1 to H8.

FIG. 4 is an exploded perspective view of a display apparatus according to an embodiment of the present disclosure.

Referring to FIG. 4, the display apparatus 200 may include a display panel 210, a front member 300, a first support member 400, a printed circuit board 500, and a flexible film 510.

The flexible film 510 may be bonded to one surface of the display panel 210. The flexible film 510 may include various components disposed on a flexible base film and supply signals to pixels and driving components in the display panel 210. The flexible film 510 may electrically connect the printed circuit board 500 to the display panel 210.

The display panel 210 may include a display area, which displays an image, and a non-display area around the display area.

The printed circuit board 500 is a component that supplies signals to a driver integrated circuit (IC), and various components for supplying various signals to the driver IC may be disposed in the printed circuit board 500. The printed circuit board 500 may be connected to the display panel 210 through the flexible film 510, and may be disposed at one side of the display panel 210 as shown in FIG. 4. Alternatively, the printed circuit board 500 may be disposed on the rear surface of the display panel 210 through the bent flexible film 510.

Although FIG. 4 shows two flexible films 510 and one printed circuit board 500, embodiments of the present disclosure are not limited thereto and the number of flexible films 510 and printed circuit boards 500 may vary depending on the design.

The first support member 400 may be disposed on the rear surface (e.g., a first surface or first side) of the display panel 210. The first support member 400 may serve to support or protect the display panel 210 on the rear surface of the display panel 210. Since the first support member 400 has a shape that corresponds to the planar shape of the display panel 210, it may cover the display panel 210.

The first support member 400 may be made of a material that is rigid and has high thermal conductivity. For example, the first support member 400 may be made of a metal material, such as aluminum (Al), copper (Cu), zinc (Zn), silver (Ag), gold (Au), iron (Fe), steel use stainless (SUS), or Invar, or a plastic material, but embodiments of the present disclosure are not limited thereto.

An optical module 600 (e.g., an optical device) may be disposed on the rear surface of the first support member 400. The optical module 600 may be any component that performs functions using light. For example, the optical module 600 may be a camera module. However, embodiments of the present disclosure are not limited thereto, and the optical module 600 may also be an illumination sensor, a fingerprint sensor, or the like.

The display panel 210 may have a (1-1) hole 210*h*, and the first support member 400 may have a (1-2) hole 400*h*.

The (1-1) hole 210*h* and the (1-2) hole 400*h* may overlap each other. The size of the (1-1) hole 210*h* and the size of the (1-2) hole 400*h* may be the same. Alternatively, the size of the (1-1) hole 210*h* and the size of the (1-2) hole 400*h* may be different from each other in order to maximize the function of the optical module 600 disposed on the rear surface of the first support member 400.

The front member 300 may be disposed on the front surface (e.g., a second surface or second side) of the display panel 210. The front member 300 may serve to protect the display panel 210 from external shock and may be permeable to light emitted from the display panel 210. The front member 300 may be disposed to overlap the display panel 210 and to cover the entire surface of the display panel 210. The front member 300 may be a cover glass, a window cover, or a cover window, but embodiments of the present disclosure are not limited thereto.

The front member 300 may serve to protect the display panel 210. In order to maintain the rigidity of the front member 300 and prevent the display panel 210 from being exposed to the outside, holes such as the (1-1) hole 210h and the (1-2) hole 400h may not be included, but embodiments of the present disclosure are not limited thereto. For example, the front member 300 may have holes overlapping the (1-1) hole 210h and the (1-2) hole 400h in order to maximize the performance of the optical module 600 disposed on the rear surface of the display panel 210.

The light that passes through the (1-1) hole 210h and the (1-2) hole 400h may include at least one of visible light, infrared light, and ultraviolet light, but embodiments of the present disclosure are not limited thereto.

Due to the nature of a transportation apparatus, the display panel 210 included in the transportation apparatus may be likely to be exposed to an environment with high temperature or humidity or to undergo repeated physical shock over a long period of time. For this reason, the display panel 210 and front member 300 included in the transportation apparatus may be made of a stretchable and/or shrinkable material. Further, the elongation of the display panel 210 may be the same as the elongation of the front member 300, but embodiments of the present disclosure are not limited thereto.

Figure 5:
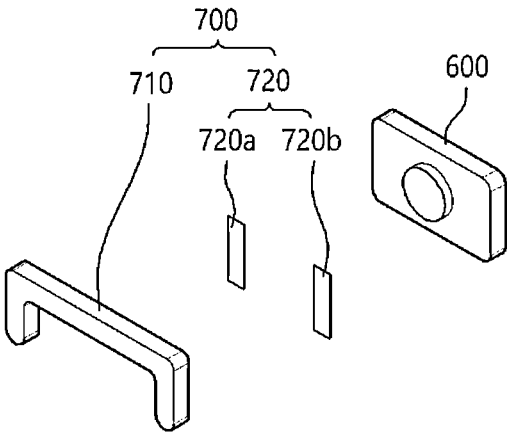
FIG. 5 is a view showing a configuration for supporting an optical module according to an embodiment of the present disclosure.

FIG. 5 is a view showing a configuration for supporting the optical module according to the embodiment of the present disclosure.

Referring to FIG. 5, the display apparatus 200 may include the optical module 600 and a second support member 700. The second support member 700 may support the optical module 600 such that the optical module 600 may be stably coupled to the display apparatus 200.

The second support member 700 may include a support body 710 and a fixing member according to one embodiment.

The support body 710 may be positioned on the rear surface of the first support member 400, and may support the optical module 600. The support body 710 may be made of a material with high rigidity so that the support body 710 may be applied to an application with a lot of movement such as a transportation apparatus.

The support body 710 may be manufactured to fit the size of the optical module 600. That is, the optical module 600 fits within the support body 710, for example. The support body 710 may be configured to surround one or more surfaces of the optical module 600 that are not disposed within the hole 400h of the first support member 400.

The fixing member may fix the optical module 600 to the rear surface of the first support member 400.

For example, the fixing member may include an adhesive member 720 which is able to attach the optical module 600 to the rear surface of the first support member 400.

In another example, the fixing member may include a first groove (or a first hook) which is formed in the first support member 400 and a first hook (or a first groove) which is formed on the optical module 600. As the first hook is caught in the first groove, the optical module 600 may be fixed to the rear surface of the first support member 400.

For another example, the fixing member may include a first coupling member for screwing the optical module 600 to the first support member 400. In this case, the fixing member may include a protruding screw which is formed on the first support member 400, a fastening hole which is formed in a portion of the optical module 600, and a nut which is fastened to the protruding screw. With the protruding screw formed on the first support member 400 inserted into the fastening hole of the optical module 600, the nut may be fastened to the protruding screw, thereby attaching the optical module 600 to the first support member 400. In addition to the examples mentioned above, various types of members may be used as the fixing member. Hereinafter, for the sake of convenience in explanation, it will be described as an example that the fixing member is the adhesive member 720.

The adhesive member 720 may be attached to the rear surface of the first support member 400 to fix (e.g., attach or connect) the optical module 600 to the first support member 400. As the adhesive member 720 fixes the first support member 400 and the optical module 600, the user of the transportation apparatus may use the optical module 600 without transmission and reception of light being distorted.

For example, the adhesive member 720 may include adhesive or double-sided tape.

The adhesive member 720 may include a first adhesive member 720a and a second adhesive member 720b. The first adhesive member 720a may be disposed on a first portion of a front surface of the optical module 600 and the second adhesive member 720b may be disposed on a second portion of the front surface of the optical module 600 that is spaced apart from the first portion, for example. The first adhesive member 720a attaches a first portion of the optical module 600 to the rear surface of the first support member 400 and the second adhesive member 720b attaches a second portion of the optical module 600 to the rear surface of the first support member 400. In the embodiment of the present disclosure, the adhesive member 720 is shown as having the first adhesive member 720a and the second adhesive member 720b, but is not limited thereto.

Figure 6:
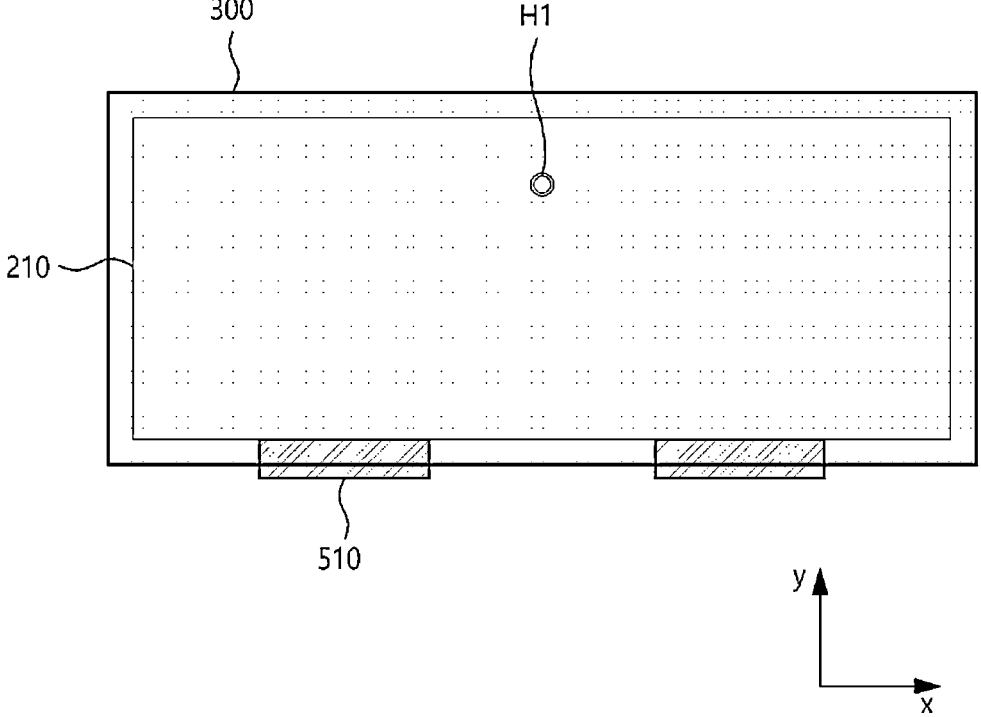
FIG. 6 is a front view of the display apparatus according to an embodiment of the present disclosure.

FIG. 6 is a front view of the display apparatus according to the embodiment of the present disclosure.

Figure 7:
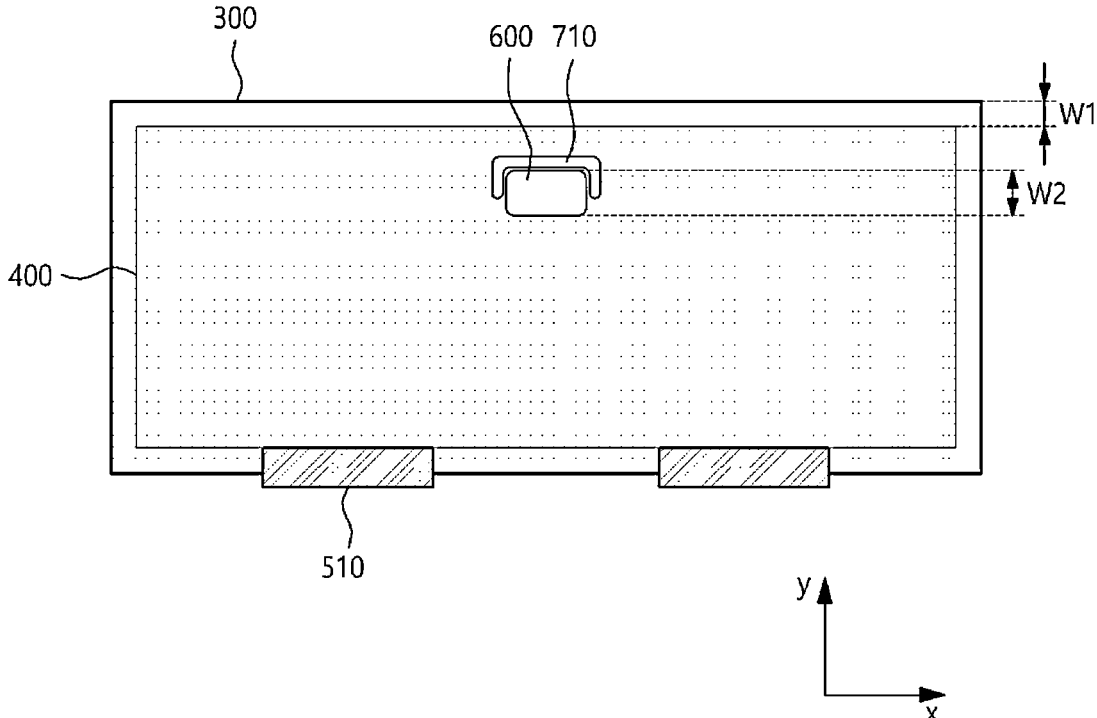
FIG. 7 is a rear view of the display apparatus according to an embodiment of the present disclosure.

FIG. 7 is a rear view of the display apparatus according to the embodiment of the present disclosure.

Referring to FIG. 6, the display apparatus 200 may include the display panel 210 and the front member 300. The display panel 210 may completely overlap the front member 300. For example, the size of the front member 300 may be larger than the size of the display panel 210.

The display apparatus 200 may include the first hole H1. In the present disclosure, the display apparatus 200 in the first area A1 is described as an example, but the embodiment of the present disclosure is not limited thereto. As shown in FIG. 4, the first hole H1 may include the (1-1) hole 210h and the (1-2) hole 400h. When viewed in the front view, the first hole H1 may be formed at the center of the display panel 210 in one direction, and may be formed adjacent to one outer surface (or one side) of the display panel 210 in another direction. For example, the first hole H1 may be formed at the center of the display panel 210 on the basis of a first direction (the x-direction) of the display panel 210 and adjacent to one outer surface (or one side) of the display panel 210 on the basis of a second direction (the y-direction) of the display panel 210. However, the position of the first hole H1 is not limited thereto.

As shown in FIG. 2, when the plurality of holes H5 and H6 are formed in the display apparatus 200 in the fifth area A5 of the dashboard 110, the plurality of holes H5 and H6 in the display apparatus 200 may be formed adjacent to one outer side (or one surface) of the display apparatus 200. The design of the position of at least one hole formed in the display apparatus 200 may be changed so that the user of the transportation apparatus may easily use the display apparatus 200.

Referring to FIG. 7, the optical module 600 may be disposed on the rear surface of the first support member 400. The optical module 600 may be disposed to overlap the first hole H1 shown in FIG. 6. For example, the optical module 600 may be disposed to overlap at least one of the display panel 210, the front member 300 and the first support member 400.

The size of the front member 300 may be larger than the size of the display panel 210 and the size of the first support member 400. Therefore, due to the difference between the size of the front member 300 and the size of the display panel 210 and the first support member 400, a portion of the front member 300 that extends past an edge (e.g., an upper edge) of the first support member 400 may have a width W1. The width W1 of the front member 300 may have a value greater than 0.

If the width W1 of the front member 300 increases, the area ratio of the display panel 210 which displays an image in the display apparatus 200 may decrease. Due to this fact, the size of the bezel of the display apparatus 200 may increase.

If the optical module 600 is disposed on the outer side of the display panel 210, in order to dispose the optical module 600, the display apparatus 200 may require a bezel which approximately has the size of a width W2 of the optical module 600. Therefore, the front member 300 may have the width W1 of the front member 300 that approximates the width W2 of the optical module 600. For example, the front member 300 may have the width W1 corresponding to the width W2 of the optical module 600.

As in the embodiment of the present disclosure shown in FIG. 7, if the optical module 600 is disposed to completely overlap the display panel 210 or the first support member 400, the display apparatus 200 may have a bezel corresponding to the width W1 of the outer part of the front member 300, regardless of the width W2 of the optical module 600. The width W1 of the outer part of the front member 300 may be smaller than the width W2 of the optical module 600. Due to this fact, when the optical module 600 overlaps the display panel 210, the display apparatus 200 may have a narrow bezel.

The optical module 600 may be fixed to the first support member 400 by being accommodated inside the support body 710.

The optical module 600 may be disposed on a plane in correspondence to the number of holes of the display panel 210. As shown in FIG. 2, when the plurality of holes H5 and H6 are formed in the display apparatus 200 disposed in the fifth area A5 of the dashboard 110, a plurality of optical modules 600 may be disposed in correspondence to the number of the plurality of holes H5 and H6, but the embodiment of the present disclosure is not limited thereto.

The flexible film 510 may be bent to connect the display panel 210 and the printed circuit board 500. The width of the bent flexible film 510 may be smaller than the width W1 of the front member 300.

Figure 8:
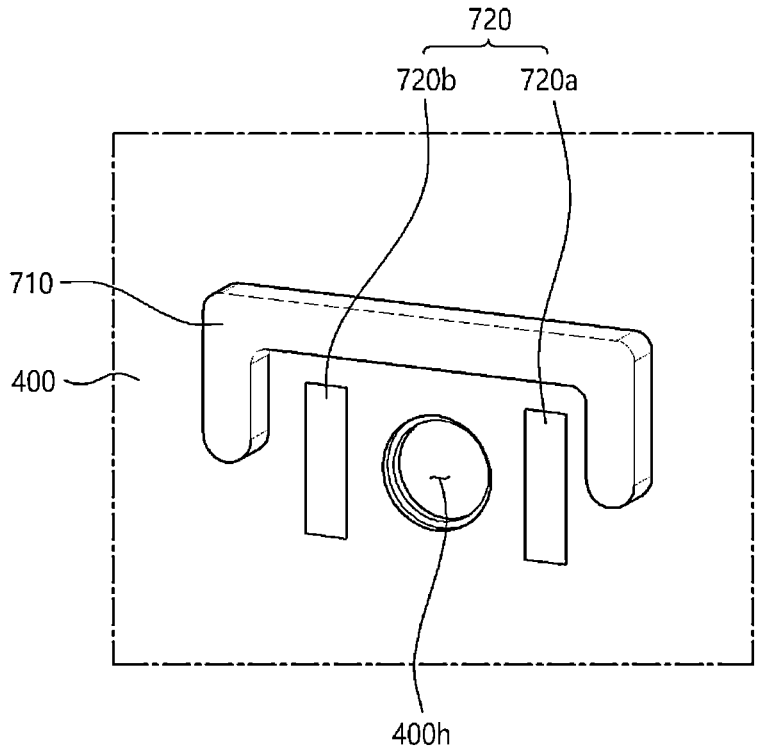
FIG. 8 is a view showing the fastening structure of the display apparatus according to an embodiment of the present disclosure.

FIG. 8 is a view showing the fastening structure of the display apparatus according to the embodiment of the present disclosure.

Referring to FIG. 8, the rear view of an area A of the display apparatus 200 shown in FIG. 4 is illustrated. The display apparatus 200 may include the support body 710 to support the optical module 600 on the rear surface of the first support member 400.

The support body 710 may be integrated with the first support member 400, and may protrude or extend in the rear direction of the first support member 400. That is, the support body 710 protrudes from the rear surface of the first support member 400 in a direction away from the rear surface of the first support member 400.

Figure 9:
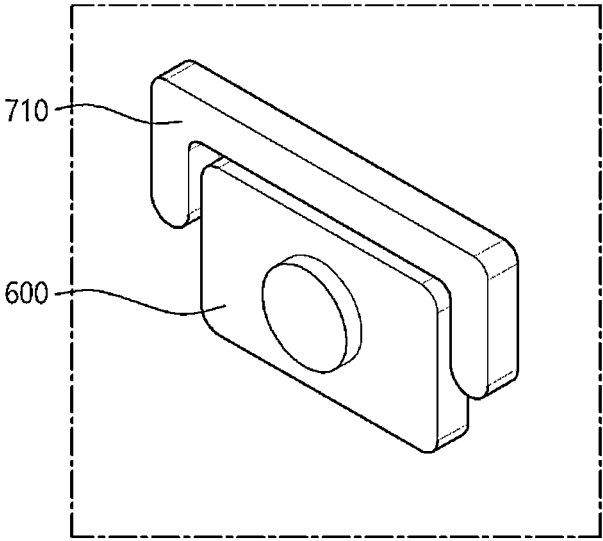
FIG. 9 is a view showing a structure in which the optical module is fastened according to an embodiment of the present disclosure.

FIG. 9 is a view showing a structure in which the optical module is fastened according to the embodiment of the present disclosure.

Referring to FIG. 9, the optical module 600 may be coupled to the support body 710. As shown in FIG. 8, the adhesive member 720 is positioned on the rear surface of the first support member 400, and may fix or connect the front surface of the optical module 600 and to the rear surface of the first support member 400. A portion of the optical module 600 is surrounded by the support body 710 while the optical module 600 is attached to the rear surface of the first support member 400 such that the support body supports a plurality of side surfaces of the optical module 600.

The optical module 600 may have any configuration which performs a function using light. For example, the optical module 600 may include a camera module or a sensor, but the embodiment of the present disclosure is not limited thereto.

Figure 10:
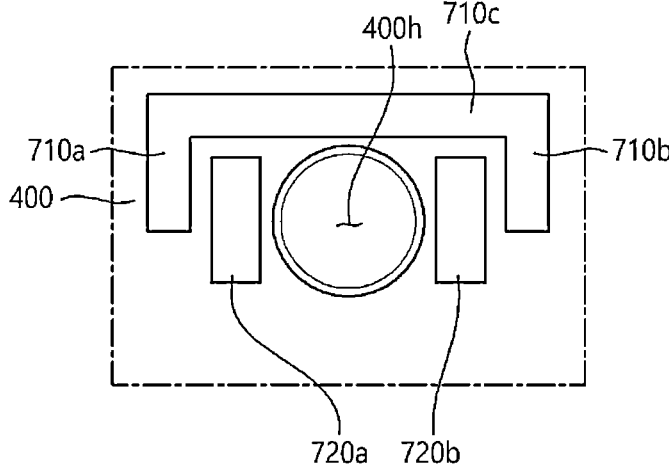
FIG. 10 is a view showing an adhesive member and support body according to an embodiment of the present disclosure.

FIG. 10 is a view showing an embodiment of an adhesive member and support body according to an embodiment of the present disclosure.

Referring to FIG. 10, the adhesive member 720 may include the first adhesive member 720a and the second adhesive member 720b.

The first adhesive member 720a may be positioned on a first side of the (1-2) hole 400h. The second adhesive member 720b may be positioned on a second of the (1-2) hole 400h such that the second adhesive member 720b is spaced apart from the first adhesive member 720a. The second side may be a side which is different from or opposite to the first side.

The support body 710 may include at least one portion. For example, the support body 710 may include a first portion 710a, a second portion 710b and a third portion 710c.

The first portion 710a may be positioned outside the first adhesive member 720a and extend in the vertical direction. As shown in FIG. 10, the first portion 710a is at a location outside the first adhesive member 720a such that the first adhesive member 720a is between the first portion 710a and the hole 400h in the first support member 400 in a plan view of the display apparatus. The second portion 710b may be positioned outside the second adhesive member 720b, is spaced apart from the first portion 710a, and extends in the vertical direction. As shown in FIG. 10, the second portion 710b is at a location outside the second adhesive member 720b such that the second adhesive member 720b is between the second portion 710b and the hole 400h in the first support member 400 in a plan view of the display apparatus.

The third portion 710c may connect the first portion 710a and the second portion 710b and extends in the horizontal direction. For example, the third portion 710c may be positioned above the (1-2) hole 400h so as to be closer to the upper side of the (1-2) hole 400h than a lower side of the (1-2) hole 400h. For example, the support body 710 may have a structure in which the first portion 710a, the second portion 710b and the third portion 710c are connected.

The support body 710 may be configured in a shape which surrounds the adhesive member 720 and the (1-2) hole 400h. For example, the third portion 710c may surround one sides (portions) of the first adhesive member 720a, the second adhesive member 720b and the (1-2) hole 400h. For example, the third portion 710c may overlap portions of the first adhesive member 720a and the second adhesive member 720b and the (1-2) hole 400h.

Figure 11:
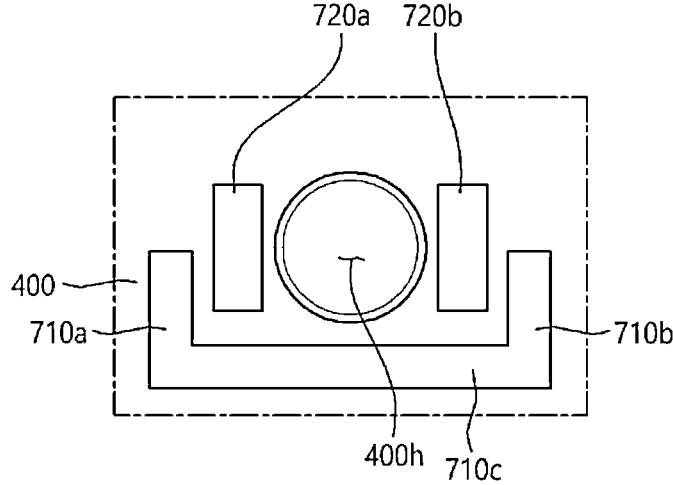
FIG. 11 is a view showing an adhesive member and support body according to another embodiment of the present disclosure.

FIG. 11 is a view showing an adhesive member and support body according to another embodiment of the present disclosure.

Referring to FIG. 11, the adhesive member 720 may include the first adhesive member 720a and the second adhesive member 720b.

The first adhesive member 720a may be positioned on a first side of the (1-2) hole 400h. The second adhesive member 720b may be positioned on a second side of the (1-2) hole 400h. The second side may be a side which is different from or opposite to the first side.

The support body 710 may include at least one portion. For example, the support body 710 may include a first portion 710a, a second portion 710b and a third portion 710c.

The first portion 710a may be positioned outside the first adhesive member 720a and extend in the vertical direction. The second portion 710b may be positioned outside the second adhesive member 720b, is spaced apart from the first portion 710a, and extend in the vertical direction. The third portion 710c may connect the first portion 710a and the second portion 710b and extend in the horizontal direction. For example, the support body 710 may have a structure in which the first portion 710a, the second portion 710b and the third portion 710c are connected.

The support body 710 may be configured in a shape which surrounds the adhesive member 720 and the (1-2) hole 400h. For example, the third portion 710c may surround one sides (portions) of the first adhesive member 720a and the second adhesive member 720b and the (1-2) hole 400h. For example, the third portion 710c may overlap portions of the first adhesive member 720a and the second adhesive member 720b and the (1-2) hole 400h.

For example, the third portion 710c may be positioned below the (1-2) hole 400h so as to be closer to the lower side of the (1-2) hole 400h than an upper side of the (1-2) hole 400h. According to the other embodiment of the present disclosure, since the third portion 710c is positioned on a lower side, it is possible to prevent force of fastening the optical module 600 to the support body 710 from decreasing due to gravity. By this fact, the optical module 600 may be firmly connected or fastened to the support body 710.

Figure 12:
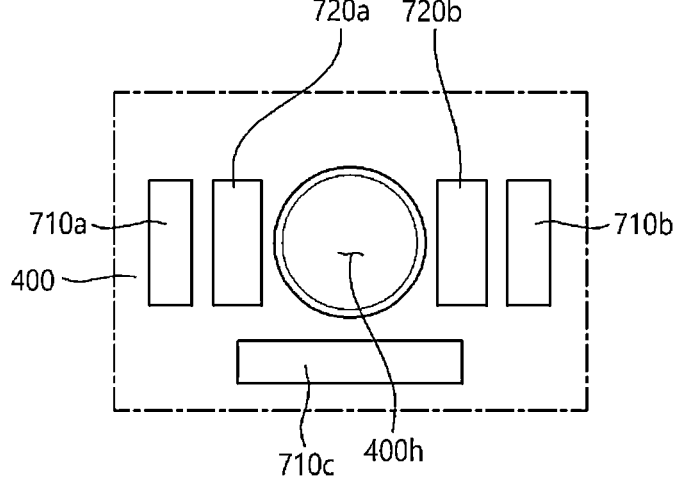
FIG. 12 is a view showing an adhesive member and support body according to still another embodiment of the present disclosure.

FIG. 12 is a view showing an adhesive member and support body according to still another embodiment of the present disclosure.

Referring to FIG. 12, the adhesive member 720 may include the first adhesive member 720a and the second adhesive member 720b.

The first adhesive member 720a may be positioned on a first side of the (1-2) hole 400h. The second adhesive member 720b may be positioned on a second side of the (1-2) hole 400h. The second side may be a side which is different from or opposite to the first side.

The support body 710 may include at least one portion. For example, the support body 710 may include a first portion 710a, a second portion 710b and a third portion 710c.

The first portion 710a may be positioned outside the first adhesive member 720a. For example, the first portion 710a may be positioned in the vicinity of the first adhesive member 720a. For example, the first portion 710a may be disposed side by side with the first adhesive member 720a. That is, the first portion 710a is at a left side of the first adhesive member 720a. As shown in FIG. 12, the first portion 710a extends in the vertical direction. The length of the first portion 710a may substantially match a diameter of the hole 400h.

The second portion 710b may be positioned outside the second adhesive member 720b. For example, the second portion 710b may be positioned in the vicinity of the second adhesive member 720b. For example, the second portion 710b may be disposed side by side with the second adhesive member 720b. That is, the second portion 710b is at a right side of the second adhesive member 720b. As shown in FIG. 12, the second portion 710b extends in the vertical direction. The length of the second portion 710b may substantially match a diameter of the hole 400h.

The third portion 710c may be positioned below the (1-2) hole 400h. In another example, the third portion 710c may be positioned above the (1-2) hole 400h. As shown in FIG. 12, the third portion 710c extends in the horizontal direction without contacting the first portion 710a and the second portion 710b. The length of the third portion 710c may be greater than the diameter of the hole 400h.

For example, the third portion 710c may be on a side different from the first portion 710a and the second portion 710b. The first portion 710a and the second portion 710b may be disposed on one surface of the first support member 400. The first portion 710a and the second portion 710b may be disposed on one surface of the first support member 400 together with the first adhesive member 720a and the second adhesive member 720b. The third portion 710c may be disposed on a side different from the one sides of the first portion 710a and the second portion 710b, for example, on the other side orthogonal to the one sides.

For example, the third portion 710c may overlap the portions of the first adhesive member 720a and the second adhesive member 720b and the (1-2) hole 400h. Since the support body 710 may support three surfaces of the four surfaces of the optical module 600, the optical module 600 may be stably coupled to the display apparatus 200.

Figure 13:
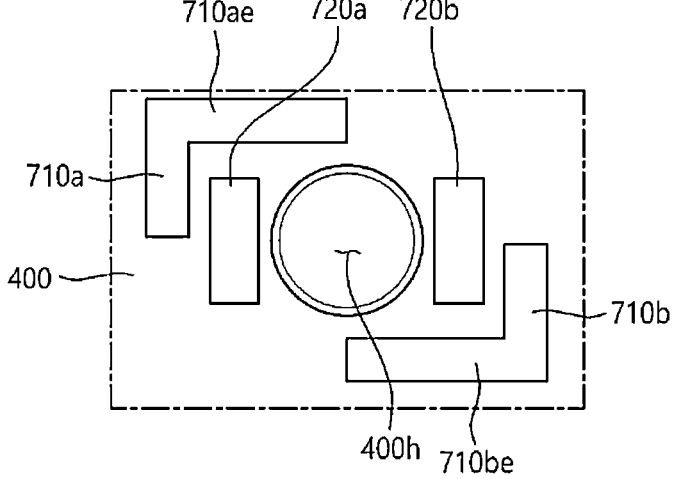
FIG. 13 is a view showing an adhesive member and support body according to yet still another embodiment of the present disclosure.

FIG. 13 is a view showing an adhesive member and support body according to yet still another embodiment of the present disclosure.

Referring to FIG. 13, the adhesive member 720 may include the first adhesive member 720a and the second adhesive member 720b.

The first adhesive member 720a may be positioned on a first side of the (1-2) hole 400h. The second adhesive member 720b may be positioned on a second side of the (1-2) hole 400h. The second side may be a side which is different from or opposite to the first side.

The support body 710 may include at least one portion. For example, the support body 710 may include a first portion 710a and a second portion 710b.

The first portion 710a is positioned outside the first adhesive member 720a, and may be positioned in the diagonal direction of the (1-2) hole 400h. The second portion 710*b* is positioned outside the second adhesive member 720*b*, and may be positioned at a position different from the first portion 710*a*. For example, the second portion 710*b* may be positioned opposite to the first portion 710*a* in the diagonal direction of the (1-2) hole 400*h*.

The first portion 710*a* may include a third portion 710*ae* that extends from the first portion 710*a*. For example, the first portion 710*a* extends in the vertical direction and the third portion 710*ae* extends from an end of the first portion 710*a* in the horizontal direction such that the third portion 710*ae* is closer to an upper surface of the (1-2) hole 400*h* in the first support member 400 than a lower surface of the (1-2) hole 400*h* in the first support member 400 in the plan view. The third portion 710*ae* may extend from the outside of the first adhesive member 720*a* to the upper side of the (1-2) hole 400*h*. The first portion 710*a* and the third portion 710*ae* may be connected to each other. For example, the first portion 710*a* and the third portion 710*ae* may be positioned adjacent to the edges of the first support member 400. For example, the first portion 710*a* and the third portion 710*ae* may be disposed on the first side of the first support member 400 and the second side of the first support member 400 which is different from (or perpendicular to) the first side. For example, the first portion 710*a* and the third portion 710*ae* may be disposed along the first side of the first support member 400 and the second side of the first support member 400 which is different from (or perpendicular to) the first side.

For example, the first portion 710*a* and the third portion 710*ae* may surround a portion of the first adhesive member 720*a* and a portion of the (1-2) hole 400*h*. For example, the first portion 710*a* and the third portion 710*ae* may overlap the portion of the first adhesive member 720*a* and the portion of the (1-2) hole 400*h*.

The second portion 710*b* may include a fourth portion 710*be* that extends from the second portion 710*b*. For example, the second portion 710*b* extends in the vertical direction and the fourth portion 710*be* extends from an end of the second portion 710*b* in the horizontal direction. The fourth portion 710*be* may extend from the outside of the second adhesive member 720*b* to the lower side of the (1-2) hole 400*h*. The second portion 710*b* and the fourth portion 710*be* may be connected to each other. For example, the second portion 710*b* and the fourth portion 710*be* may be positioned adjacent to the edges of the first support member 400. For example, the second portion 710*b* and the fourth portion 710*be* may be disposed on the third side of the first support member 400 and the fourth side of the first support member 400 which is different from (or perpendicular to) the third side. For example, the second portion 710*b* and the fourth portion 710*be* may be disposed along the third side of the first support member 400 and the fourth side of the first support member 400 which is different from (or perpendicular to) the third side.

For example, the second portion 710*b* and the fourth portion 710*be* may surround a portion of the second adhesive member 720*b* and a portion of the (1-2) hole 400*h*. For example, the second portion 710*b* and the fourth portion 710*be* may overlap the portion of the second adhesive member 720*b* and the portion of the (1-2) hole 400*h*.

By including the third portion 710*ae* which extends from the outside of the first adhesive member 720*a* to the upper side of the (1-2) hole 400*h* and the fourth portion 710*be* extending from the outside of the second adhesive member 720*b* to the lower side of the (1-2) hole 400*h*, the support body 710 may support all of the four surfaces of the optical module 600, and thus, may support the optical module 600 more stably.

Although the adhesive member 720 is shown as including the first adhesive member 720*a* and the second adhesive member 720*b*, the embodiment of the present disclosure is not limited thereto.

Figure 14:
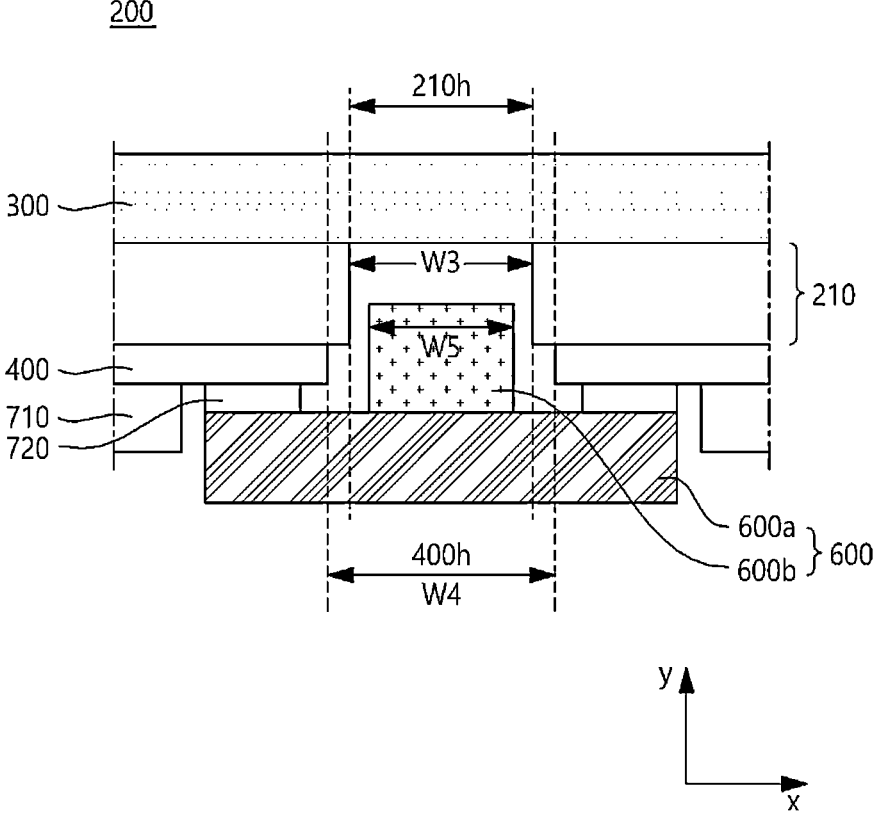
FIG. 14 is a sectional view of the display apparatus according to an embodiment of the present disclosure.

FIG. 14 is a sectional view of the display apparatus according to an embodiment of the present disclosure.

Referring to FIG. 14, the display apparatus 200 may include a front member 300, a display panel 210, a first support member 400, a support body 710, an adhesive member 720, and an optical module 600.

The display panel 210 may be disposed between the front member 300 and the first support member 400. The adhesive member 720 may be attached to the first support member 400 to adhere the first support member 400 and the optical module 600. The thickness of the adhesive member 720 may be thinner than the thickness of the support body 710.

The support body 710 may be positioned outside the optical module 600. Since the support body 710 has a shape which surrounds the optical module 600, the optical module 600 may be more stably coupled to the display apparatus 200.

The center of the (1-1) hole 210*h* may correspond to the center of the (1-2) hole 400*h*. For example, when each of the (1-1) hole 210*h* and the (1-2) hole 400*h* is circular, the (1-1) hole 210*h* and the (1-2) hole 400*h* may be concentric with each other. That is, centers of the (1-1) hole 210*h* and the (1-2) hole 400*h* are aligned with each other.

The display apparatus 200 may have a width W3 of the (1-1 hole) 210*h* and a width W4 of the (1-2) hole 400*h*. The width W3 of the (1-1) hole 210*h* and the width W4 of the (1-2) hole 400*h* may each be referred to as the size or diameter. The width W3 of the (1-1) hole 210*h* and the width W4 of the (1-2) hole 400*h* may be the same as or different from each other. In order for the display apparatus 200 to have a hole size (e.g., diameter) optimized for the optical module 600, the width W3 of the (1-1) hole 210*h* and the width W4 of the (1-2) hole (400*h*) may be different from each other. For example, the width W3 of the (1-1) hole 210*h* may be smaller than the width W4 of the (1-2) hole 400*h*.

As the width W3 of the (1-1) hole 210*h* is smaller than the width W4 of the (1-2) hole 400*h*, the size of the (1-1) hole 210*h* of the display panel 210 may be reduced as much as possible. This may mean expansion of the display area of the display panel 210. Accordingly, a user may maximally experience the area of the display panel 210 that displays an image in the limited size of the display apparatus 200.

Since the width W3 of the (1-1) hole 210*h* is smaller than the width W4 of the (1-2) hole 400*h*, the gap between an upper portion 600*b* of the optical module 600 and the (1-1) hole 210*h* of the display panel 210 may be reduced. Accordingly, it is possible to prevent or at least reduce light from leaking between the upper portion 600*b* of the optical module 600 and the (1-1) hole 210*h* of the display panel 210. Due to this fact, the optical module 600, which is a type of light reception device, may receive more light, and thus, may perform an operation according to light reception more accurately. The operation of the optical module 600 according to light reception may include an image sensing operation (a camera operation) or a surrounding object detection operation.

The optical module 600 may include a lower portion 600*a* and the upper portion 600*b*. The upper portion 600*b* may include an area corresponding to the (1-1) hole 210*h* and the (1-2) hole 400*h*.

The upper portion 600*b* may have a width W5. The width W5 of the upper portion 600*b* may be smaller than the width W3 of the (1-1) hole 210*h*. When the display apparatus 200 is applied to various applications, the optical module 600 coupled to the display panel 210 through the support body 710 and the adhesive member 720 may shake. For example, since a transportation apparatus may be exposed to more diverse environments than when the display apparatus 200 is applied to other applications, it may be required to have higher reliability.

Thus, as the width W5 of the upper portion 600*b* is smaller than the (1-1) hole 210*h*, it is possible to prevent a collision between the optical module 600 and the display panel 210, which may occur when the display apparatus 200 moves.

Although FIG. 14 shows that one optical module 600 is disposed on the rear surface of the display panel 210, embodiments of the present invention are not limited thereto. For example, the display panel 210 may include the first hole, which includes the (1-1) hole 210*h* and the (1-2) hole 400*h*, and a second hole different from the first hole.

According to one or more embodiments of the present disclosure, the (1-1) hole and the (1-2) hole may be corresponding to each other and may have the same or different sizes.

According to one or more embodiments of the present disclosure, a width of an area of the optical module corresponding to the first hole may be smaller than a width of the first hole.

Figure 15:
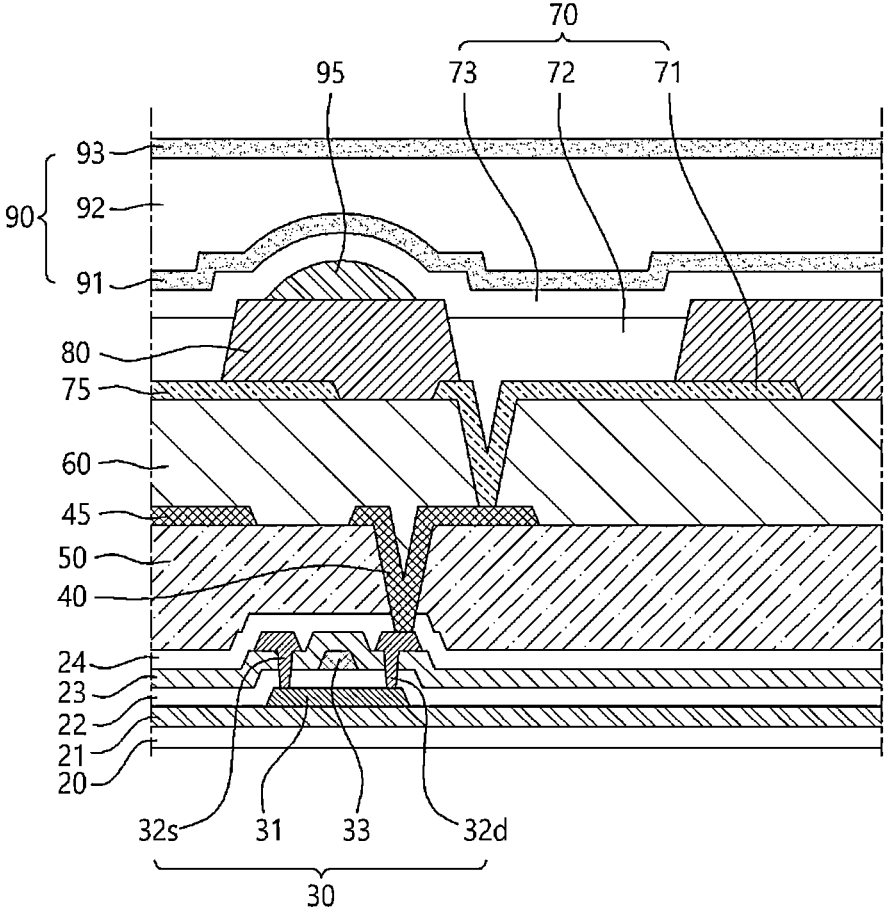
FIG. 15 is a sectional view of the display area in the display apparatus according to an embodiment of the present disclosure.

FIG. 15 is a sectional view of the display area in the display apparatus according to an embodiment of the present disclosure.

Referring to FIG. 15, the display apparatus may include a substrate 20. The substrate 20 may be formed over the display area of the display panel and the non-display area adjacent to the display area, and may serve to support and protect components of the display apparatus. The substrate 20 may be made of glass or a flexible material such as polyimide, but embodiments of the present disclosure are not limited thereto. A plurality of substrates 20 may be included, and a dielectric layer may be formed between the plurality of substrates 20.

A buffer layer 21 may be formed on the substrate 20 to protect various components of the display apparatus from the penetration of water and hydrogen from the outside of the substrate 20. The buffer layer 21 may serve to enhance the adhesion between the layers formed on the buffer layer 21 and the substrate 20 and block various types of defects, such as alkaline components, which leak from the substrate 20. The buffer layer 21 may serve to prevent or delay the diffusion of water or oxygen that has penetrated the substrate 20.

The buffer layer 21 may be formed of silicon oxide (SiOx), silicon nitride (SiNx), silicon oxynitride (SiNxOx), or the like, but embodiments of the present disclosure are not limited thereto.

A thin-film transistor 30 including an active layer 31, a gate electrode 33, a source electrode 32*s*, and a drain electrode 32*d* may be disposed on the buffer layer 21.

Although FIG. 15 shows only a driving thin-film transistor among various thin-film transistors that may be included in the display apparatus 200, other thin-film transistors such as switching thin-film transistors may also be included in the display apparatus 200.

The active layer 31 may be disposed on the buffer layer 21. The active layer 31 may be formed of amorphous silicon, or polycrystalline silicon, which may be applied to a driving thin-film transistor in a pixel due to its better mobility, lower energy consumption and higher reliability than amorphous silicon, or an oxide semiconductor such as zinc oxide (ZnO) or indium-gallium-zinc oxide (IGZO), which has excellent mobility and uniformity characteristics, but embodiments of the present disclosure are not limited thereto. When the active layer is formed of an oxide semiconductor, it has an excellent effect of blocking leakage current, making it possible to minimize changes in luminance of sub-pixels during low-speed driving.

A first dielectric layer 22 may be disposed on the active layer 31. The first dielectric layer 22 may serve to insulate the active layer 31 and the gate electrode 33. The first dielectric layer 22 may be formed of a inorganic dielectric material such as silicon oxide (SiOx), silicon nitride (SiNx), or silicon oxynitride (SiNxOx), or may be formed of a organic dielectric material, etc., without being limited thereto.

A gate electrode 33 may be disposed on the first dielectric layer 22. The gate electrode 33 may be disposed to overlap the active layer 31.

The gate electrode 33 may be composed of a single layer or multiple layers formed of any one of molybdenum (Mo), copper (Cu), titanium (Ti), aluminum (Al), chromium (Cr), gold (Au), nickel (Ni), neodymium (Nd), and tungsten (W), or an alloy thereof, without being limited thereto.

A second dielectric layer 23 may be disposed on the gate electrode 33. The second dielectric layer 23 may be formed of a inorganic dielectric material such as silicon oxide (SiOx), silicon nitride (SiNx), or silicon oxynitride (SiNxOx), or may be formed of an organic dielectric material, etc., without being limited thereto.

A source electrode 32*s* and a drain electrode 32*d* may be disposed on the second dielectric layer 23. The source electrode 32*s* and the drain electrode 32*d* may be electrically connected to the active layer 31 via the first and second dielectric layers 22 and 23.

The source electrode 32*s* and the drain electrode 32*d* may each be composed of a single layer or multiple layers formed of any one of molybdenum (Mo), copper (Cu), titanium (Ti), aluminum (Al), chromium (Cr), gold (Au), nickel (Ni), and neodymium (Nd), or an alloy thereof, without being limited thereto. For example, the source electrode 32*s* and the drain electrode 32*d* may each be composed of a three-layer structure of titanium (Ti)/aluminum (Al)/titanium (Ti), which are conductive metals, without being limited thereto.

A third dielectric layer 24 may be formed on the thin-film transistor 30. The third dielectric layer 24 may serve to protect the thin-film transistor 30. The third dielectric layer 24 may be formed of a inorganic dielectric material such as silicon oxide (SiOx), silicon nitride (SiNx), or silicon oxynitride (SiNxOx), or may be formed of a organic dielectric material, etc. without being limited thereto.

A first protective layer 50 may be formed on the third dielectric layer 24. The first protective layer 50 may be formed of at least one of organic dielectric materials such as acrylic resin, epoxy resin, phenolic resin, polyamide resin, or polyimide resin, without being limited thereto. For example, the first protective layer 50 may be a planarization layer or a dielectric layer, but embodiments of the present disclosure are not limited thereto. A connection electrode 40 may be formed on the first protective layer 50. The connection electrode 40 may serve to electrically connect a light-emitting part 70 and the thin-film transistor 30. The connection electrode 40 may be electrically connected to the thin-film transistor 30 via the third dielectric layer 24 and the first protective layer 50. For example, the connection electrode 40 may be electrically connected to the drain electrode 32*d* of the thin film transistor 30 via the third dielectric layer 24 and the first protective layer 50. A first metal layer 45 may be formed on the same layer as the connection electrode 40.

A second protective layer 60 may be formed on the first protective layer 50. The connection electrode 40 may be formed between the first protective layer 50 and the second protective layer 60.

The second protective layer 50 may be formed of at least one of organic dielectric materials such as acrylic resin, epoxy resin, phenolic resin, polyamide resin, or polyimide resin, without being limited thereto. For example, the second protective layer 60 may be a planarization layer or a dielectric layer, but embodiments of the present disclosure are not limited thereto.

When the first protective layer 50 and the second protective layer 60 are formed of a dielectric material, capacitance may be formed between the metal layers.

The light-emitting part 70 including a first electrode 71, a light-emitting layer 72, and a second electrode 73 may be disposed on the second protective layer 60.

The first electrode 71 may be disposed on the second protective layer 60.

The first electrode 71 serves to supply holes to the light-emitting layer 72 and may be formed of a conductive material having a high work function.

When the display apparatus is of a top emission type, the first electrode 71 may a reflective electrode that reflects light, and may be formed of an opaque conductive material. The first electrode 71 may be formed of at least one of silver (Ag), aluminum (Al), gold (Au), molybdenum (Mo), tungsten (W), chromium (Cr), or alloys thereof, or may also be composed of a three-layer structure of silver (Ag)/palladium (Pd)/copper (Cu), without being limited thereto.

When the display apparatus is of a bottom emission type, the first electrode 71 may be formed of a transparent conductive material that is permeable to light. The first electrode 71 may be formed of at least one of indium tin oxide (ITO) and indium zinc oxide (IZO), but embodiments of the present disclosure are not limited thereto.

The second metal layer 75 may be formed on the same layer as the first electrode 71. The second metal layer 75 may be formed to overlap the first metal layer 45.

A bank 80 may be disposed in some areas on the first electrode 71 and in some areas of the second protective layer 60.

The bank 80 may divide a single pixel into multiple sub-pixels, and may serve to minimize light glare and prevent light mixing occurring at various viewing angles.

The bank 80 may have a bank hole that is disposed in an area excluding the light-emitting area and exposes the first electrode 71.

The bank 80 may be formed of at least one of inorganic dielectric materials, such as silicon nitride (SiNx) or silicon oxide (SiOx), or organic dielectric materials, such as acryl resin, epoxy resin, phenolic resin, or polyamide resin, or polyimide resin, without being limited thereto.

A spacer 95 may be further disposed on the bank 80. The spacer 95 may serve to minimize damage to the display apparatus 200 by external shock.

A light-emitting layer 72 may be disposed on the first electrode 71. The light-emitting layer 72 may be formed of an organic material to emit light of a specific color. The light-emitting layer 72 may be composed of at least one of a red organic light-emitting layer, a green organic light-emitting layer, a blue organic light-emitting layer, and a white organic light-emitting layer. A color filter may be further disposed on the light-emitting part 70.

A second electrode 73 may be disposed on the light-emitting layer 72. The second electrode 73 serves to supply electrons to the light-emitting layer 72 and may be formed of a conductive material having a low work function.

When the display apparatus 200 is of a top emission type, the second electrode 73 may be formed of a transparent conductive material that is permeable to light. The second electrode 73 may be formed of at least one of indium tin oxide (ITO) and indium zinc oxide (IZO), without being limited thereto.

When the display apparatus is of a bottom emission type, the second electrode 73 may be a reflective electrode that reflects light, and may be formed of an opaque conductive material. The second electrode 73 may be formed of at least one of silver (Ag), aluminum (Al), gold (Au), molybdenum (Mo), tungsten (W), chromium (Cr), or alloys thereof.

An encapsulation 90 may be disposed on the light-emitting part 70. The encapsulation 90 may include a first encapsulation layer 91, a second encapsulation layer 92, and a third encapsulation layer 93, but the number of the encapsulation layers does not limit the content of the present disclosure.

The encapsulation 90 may serve to block the penetration of water or oxygen, and may be formed over the display area and the non-display area.

The first encapsulation layer 91 and the third encapsulation layer 93 may each be formed of at least one inorganic material selected from among the group consisting of silicon nitride (SiNx), silicon oxide (SiOx), or aluminum oxide (AlyOz), but embodiments of the present disclosure are not limited thereto.

The second encapsulation layer 92 may cover foreign substances or particles that may occur during the manufacturing process.

The second encapsulation layer 92 may be formed of a polymer such as silicon oxycarbon (SiOCz), epoxy, polyimide, or polyethylene, without being limited thereto.

Figure 16:
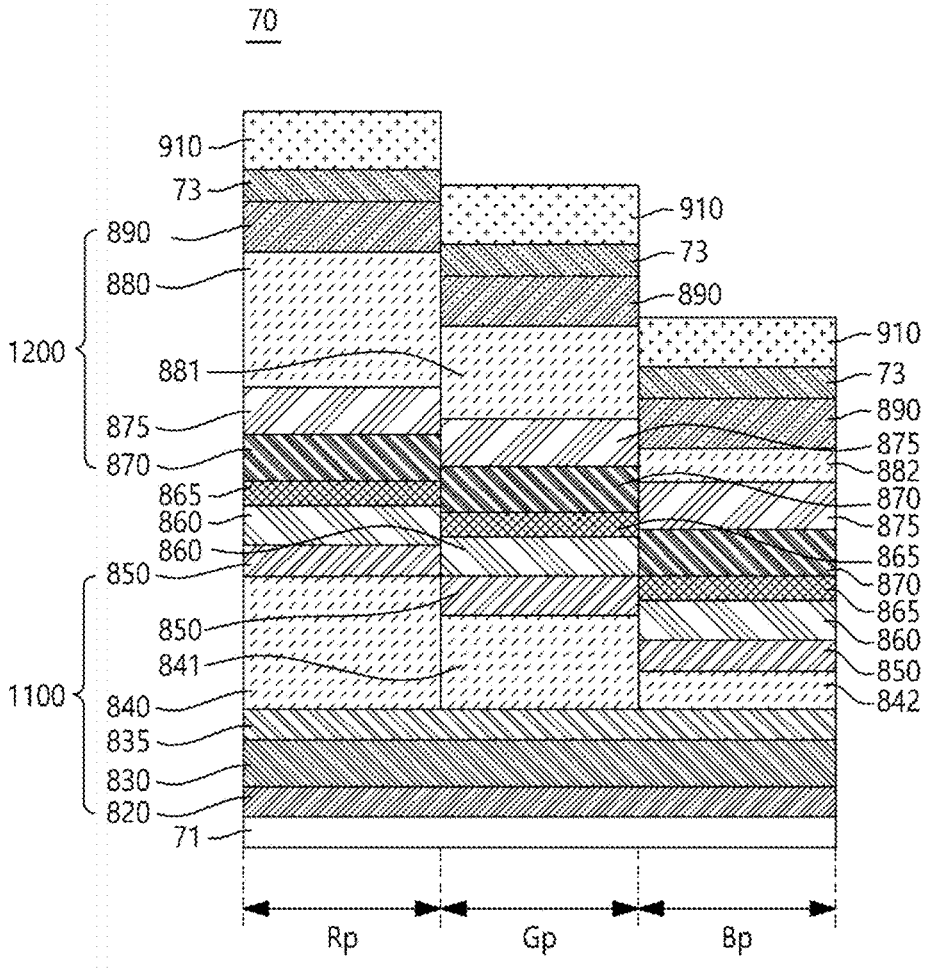
FIG. 16 shows the structure of an organic light-emitting element in the display apparatus according to an embodiment of the present disclosure.

FIG. 16 shows the structure of an organic light-emitting element in the display apparatus according to an embodiment of the present disclosure.

Referring to FIG. 16, the display apparatus may include an organic light-emitting element 70.

The organic light-emitting element 70 may include a first electrode (anode) 71 formed on a substrate in which a red sub-pixel area Rp, a green sub-pixel area Gp, and a blue sub-pixel area Bp are defined, a hole injection layer (HIL) 820, a first hole transporting layer ($1^{st}$ HTL) 830, a first hole control layer ($1^{st}$ HCL) 835, a first organic light-emitting layer composed of a first red light-emitting layer ($1^{st}$ red EML) 840, a first green light-emitting layer ($1^{st}$ green EML) 841, and a first blue light-emitting layer ($1^{st}$ blue EML) 842, a first electron transporting layer ($1^{st}$ ETL) 850, a first charge generation layer (N-CGL) 860, a second charge generation layer (P-CGL) 865, a second hole transporting layer ($2^{nd}$ HTL) 870, a second hole control layer ($2^{nd}$ HCL) 875, a second organic light-emitting layer composed of a second red light-emitting layer ($2^{nd}$ red EML) 880, a second green light-emitting layer ($2^{nd}$ green EML) 881, and a second blue light-emitting layer ($2^{nd}$ blue EML) 882, a second electron transporting layer ($2^{nd}$ ETL) 890, a second electrode (cathode) 73, and a capping layer (CPL) 910.

In addition, the organic light-emitting element 70 according to an embodiment of the present disclosure may be an organic light-emitting element having a two-stack structure in which a first light-emitting unit ($1^{st}$ EL unit) 1100 including the first organic light-emitting layer and a second light-emitting unit (2$^{nd}$ EL unit) 1200 including the second organic light-emitting layer are stacked between the first electrode 71 and the second electrode 73.

For example, in the organic light-emitting element 70 according to an embodiment of the present disclosure, the first light-emitting unit (or first light-emitting part) 1100 includes a hole injection layer 820, a first hole transporting layer 830, a first hole control layer 835, a first organic light-emitting layer composed of a first red light-emitting layer 840, a first green light-emitting layer 841, and a first blue light-emitting layer, and a first electron transporting layer 850.

In the organic light-emitting element 70 according to an embodiment of the present disclosure, the second light-emitting unit (or second light-emitting part) 1200 may include a second hole transporting layer 870, a second hole control layer 875, a second organic light-emitting layer composed of a second red light-emitting layer 880, a second green light-emitting layer 881, and a second blue light-emitting layer 882, and a second electron transporting layer 890.

The organic light-emitting element 70 according to an embodiment of the present disclosure may include a first charge generation layer 860, which is an n-type charge generation layer located between the first light-emitting unit 1100 and the second light-emitting unit 1200, a second charge generation layer 865, which is a p-type charge generation layer.

In the display apparatus including the organic light-emitting element according to an embodiment of the present disclosure, a gate line and a data line that intersect each other to define each pixel area, and a power line that extends parallel to any one of them, are located on the substrate, and a switching thin-film transistor connected to the gate line and data line and a driving thin-film transistor connected to the switching thin-film transistor are located in each pixel area. The driving thin-film transistor may be connected to the first electrode (anode) 71.

The first electrode 71 is located on the substrate so as to correspond to each of the red sub-pixel area Rp, the green sub-pixel area Gp, and the blue sub-pixel area Bp, and may be composed of a reflective electrode.

For example, the first electrode 71 may include a transparent conductive material layer having a high work function, such as indium-tin-oxide (ITO), and a reflective material layer, such as silver (Ag) or a silver (Ag) alloy, but embodiments of the present disclosure are not limited thereto.

The hole injection layer 820 may be located on the first electrode 71 so as to correspond to all of the red sub-pixel area Rp, the green sub-pixel area Gp, and the blue sub-pixel area Bp.

The hole injection layer 820 may serve to facilitate hole injection, and may be formed of any one or more of 1,4,5,8,9,11-hexaazatriphenylene-hexanitrile (HATCN), copper phthalocyanine (CuPc), poly(3,4)-ethylenedioxy-thiophene (PEDOT), and N,N-dinaphthyl-N,N'-diphenyl-benzidine (NPD), without being limited thereto.

The first hole transporting layer 830 and the second hole transporting layer 870 are each formed to correspond to all of the red sub-pixel area Rp, the green sub-pixel area Gp, and the blue sub-pixel area Bp. The first hole transporting layer 830 may be located on the hole injection layer 820, and the second hole transporting layer 870 may be located on the second charge generation layer 865.

The first hole transporting layer 830 and the second hole transporting layer 870 serve to facilitate hole transport, and may be formed of any one or more of N,N-dinaphthyl-N, N'-diphenylbenzidine (NPD), N,N'-bis-(3-methylphenyl)-N, N'-bis-(phenyl)-benzidine (TPD), s-TAD, and 4,4',4"-tris(N-3-methylphenyl-N-phenyl-amino)-triphenylamine (MTDATA), without being limited thereto.

In the organic light-emitting element 70 according to an embodiment of the present disclosure, the first hole control layer 835 may be located on the first hole transporting layer 830 so as to correspond to all of the red sub-pixel area Rp, the green sub-pixel area Gp, and the blue sub-pixel area Bp.

The second hole control layer 875 may be located on the second hole transporting layer 870 so as to correspond to all of the red sub-pixel area Rp, the green sub-pixel area Gp, and the blue sub-pixel area Bp.

Holes have higher mobility than electrons at high temperatures. The first hole control layer 835 and the second hole control layer 875 may prevent a phenomenon in which holes leave the light-emitting area by moving to the first electron transporting layer 850 and the second electron transporting layer 890 via the first organic light-emitting layer composed of the first red light-emitting layer 840, the first green light-emitting layer 841, and the first blue light-emitting layer 842, and the second organic light-emitting layer composed of the second red light-emitting layer 880, the second green light-emitting layer 881, and the second blue light-emitting layer 882, which are the area in which electrons and holes recombine to emit light. The first hole control layer 835 and the second hole control layer 875 may each be formed of a material such as a carbazole derivative, a triarylamine derivative, or a triamine derivative. For example, the first hole control layer 835 and the second hole control layer 875 may each be formed of any one or more of N,N'-bis(3-methylphenyl)-N,N'-bis(phenyl)-benzidine (TPD), bis [N-(1-naphthyl)-N-phenyl]benzidine (α-NPB), 1,3,5-tris(4-diphenylaminophenyl)benzene (TDAPB), tris (4-carbazoyl-9-yl)triphenylamine (TCTA), spiro-TAD (2,2', 7,7'-tetrakis(N,N-diphenylamino)-9,9-spirobifluorene, 4,4'-bis(40 arbazole-9-yl)biphenyl (CBP), 4-[bis(9,9-dimethylfluoren-2-yl)amino]phenyl group (BFA-IT), spiro-TCBz (triclabendazole), and TBA, without being limited thereto.

The first hole control layer 835 and the second hole control layer 875 may be formed of the same material selected from among the materials described above, or may be formed of different materials selected from among the materials described above in consideration of the mobility of holes in the first light-emitting unit 1100 and the second light-emitting unit 1200.

The first red light-emitting layer 840 may be located in the red sub-pixel area Rp on the first hole transport layer 830, and the second red light-emitting layer 880 may also be located in the red sub-pixel area Rp on the second hole transporting layer 870. The first red light-emitting layer 840 and the second red light-emitting layer 880 may each include a light emitting material that emits red light, wherein the light emitting material may be formed using a phosphorescent material or a fluorescent material.

For example, the first red light-emitting layer 840 and the second red light-emitting layer 880 may each include a host material including 4,4'-bis(carbozol-9-yl)biphenyl (CBP) or 1,3-bis(N-carbozolyl)benzene (mCP), and may each be formed of a phosphorescent material including a dopant including any one or more of bis(1-phenylquinoline) acety-lacetonate iridium (PQIr(acac)), tris(1-phenylquinoline) iridium (PQIr), and octaethylporphyrin platinum (PtOEP).

Alternatively, the first red light-emitting layer 840 and the second red light-emitting layer 880 may each be formed of a fluorescent material including PBD:Eu(DBM)3(Phen) or perylene, without being limited thereto.

The first green light-emitting layer 841 may be located in the green sub-pixel area Gp on the first hole transporting layer 830, and the second green light-emitting layer 881 may also be located in the green sub-pixel area Gp on the second hole transporting layer 870. The first green light-emitting layer 841 and the second green light-emitting layer 881 may each include a light-emitting material that emits green light, wherein the light-emitting material may be formed using a phosphorescent material or a fluorescent material.

For example, the first green light-emitting layer 841 and the second green light-emitting layer 881 may each include a host material including CBP or mCP, and may each be formed of a phosphorescent material containing a dopant material, such as an iridium (Ir) complex including tris(2-phenylpyridine) iridium (Ir(ppy)$_3$(fac). Alternatively, the first green light-emitting layer 841 and the second green light-emitting layer 881 may each be formed of a fluorescent material including tris(8-hydroxyquinolino)aluminum (Alq3), without being limited thereto.

The first blue light-emitting layer 842 may be located in the blue sub-pixel area Bp on the first hole transporting layer 830, and the second blue light-emitting layer 882 may also be located in the blue sub-pixel area Bp on the second hole transporting layer 870. The first blue light-emitting layer 842 and the second blue light-emitting layer 882 may each include a light-emitting material that emits blue light, wherein the light-emitting material may be formed using a phosphorescent material or a fluorescent material.

For example, the first blue light-emitting layer 842 and the second blue light-emitting layer 882 may each include a host material including CBP or mCP, and may each be formed of a phosphorescent material containing a dopant material including (4,6-F2ppy)2Irpic, but embodiments of the present disclosure are not limited thereto. In addition, the first blue light-emitting layer 842 and the second blue light-emitting layer 882 may each be formed of a fluorescent material containing any one of spiro-DPVBi, spiro-6P, distyrylbenzene (DSB), distyrylarylene (DSA), PFO-based polymer, and a PPV-based polymer, without being limited thereto.

The first electron transport layer 850 may be located on the first red light-emitting layer 840, the first green light-emitting layer 841, and the first blue light-emitting layer 842 so as to correspond to all of the red sub-pixel region Rp, the green sub-pixel region Gp, and the blue sub-pixel region Bp. The second electron transport layer 890 may be located on the second red light-emitting layer 880, the second green light-emitting layer 881, and the second blue light-emitting layer 882 so as to correspond to all of the red sub-pixel area Rp, the green sub-pixel area Gp, and the blue sub-pixel area Bp.

The first electron transporting layer 850 and the second electron transporting layer 890 may transport and inject electrons, and the thickness of each of the first electron transporting layer 850 and the second electron transporting layer 890 may be determined in consideration of the electron transport characteristics thereof.

The first electron transporting layer 850 and the second electron transporting layer 890 may serve to facilitate electron transport, and may each be formed of any one or more of tris(8-hydroxyquinolino)aluminum (Alq3), 2-(4-biphenylyl)-5-(4-tert-butylpheny)-1,3,4oxadiazole (PBD), TAZ, spiro-PBD, Balq, and Sal, without being limited thereto.

It is possible to additionally provide an electron injection layer (EIL) on the second electron transporting layer 890.

The electron injection layer (EIL) may be formed of tris(8-hydroxyquinolino)aluminum (Alq3), 2-(4-biphenylyl)-5-(4-tert-butylpheny)-1,3,4oxadiazole (PBD), TAZ, spiro-PBD, Balq, or Salq, without being limited thereto.

Here, the structure is not limited according to the embodiment of the present disclosure, and at least any one of the hole injection layer 820, the first hole transport layer 830, the second hole transporting layer 870, the first electron transporting layer 850, the second electron transporting layer 890, and the electron injection layer (EIL) may also be omitted. In addition, at least any one of two of the first hole transporting layer 830, the second hole transporting layer 870, the first electron transporting layer 850, the second electron transporting layer 890, and the electron injection layer (EIL) may also be composed of two or more layers.

The first charge generation layer 860 may be located on the first electron transporting layer 850 so as to correspond to all of the red sub-pixel region Rp, the green sub-pixel region Gp, and the blue sub-pixel region Bp. The second charge generation layer 865 may be located on the first charge generation layer 860 so as to correspond to all of the red sub-pixel region Rp, the green sub-pixel region Gp, and the blue sub-pixel region Bp. The first charge generation layer 860 and the second charge generation layer 865 may have an N-P junction structure.

Referring to FIG. 16, the first charge generation layer 860 and the second charge generation layer 865 may be located between the first light-emitting unit 1100 and the second light-emitting unit 1200. The first charge generation layer 860 and the second charge generation layer 865 may control the charge balance between the two light-emitting units, that is, the first light-emitting unit 1100 and the second light-emitting unit 1200.

The first charge generation layer 860 may serve as an n-type charge generation layer (n-CGL) that assists the injection of electrons into the first light-emitting unit 1100 located below the first charge generation layer 860. The second charge generation layer 865 may serve as a p-type charge generation layer (p-CGL) that assists the injection of electrons into the second light-emitting unit 1200 located above the second charge generation layer 865.

For example, the first charge generation layer 860, which is an n-type charge generation layer (n-CGL) that serves to inject electrons, may be formed of an alkali metal, an alkali metal compound, or an organic material or a compound thereof that serves to inject electrons. In addition, the host material of the first charge generation layer 860 may be composed of the same material as the material of each of the first electron transport layer 850 and the second electron transport layer 890. For example, it may be composed of a mixed layer in which an organic material such as an anthracene derivative is doped with a dopant such as lithium (Li), without being limited thereto.

The second charge generation layer 865 may be located on the first charge generation layer 860. The second charge generation layer 865 serves as a p-type charge generation layer (p-CGL) serving to inject holes, and the host material of the second charge generation layer 865 may be composed of the same material as the material of each of the first hole injection layer 820, the first hole transporting layer 830, and the second hole transporting layer 870. For example, it may be composed of a mixed layer in which an organic material such as 1,4,5,8,9,11-hexaazatriphenylene-hexanitrile (HATCN), cupper phthalocyanine (CuPc), or tris(4-bromophenyl)aluminum hexachloroantimonate (TBAHA) is doped with a p-type dopant, without being limited thereto. Here, the p-type dopant may be composed of any one of F4-TCNQ and NDP-9, without being limited thereto.

The second electrode 73 is located on the second electron transport layer 890 so as to correspond to all of the red sub-pixel area Rp, the green sub-pixel area Gp, and the blue sub-pixel area (Bp). For example, the second electrode 73 may be formed of an alloy of magnesium and silver (Mg:Ag) and may have transflective characteristics. For example, the light emitted from the organic light-emitting layer is emitted to the outside through the second electrode 73, and some of the light is directed back to the first electrode 71 since the second electrode 73 has transflective characteristics.

As such, due to a micro-cavity effect in which repetitive reflection occurs between the first electrode 71 and the second electrode 73, which acts as a reflective layer, light is repeatedly reflected within the cavity between the first electrode 71 and the second electrode 73, thereby increasing light efficiency.

In addition, the first electrode 71 may be composed of a transparent electrode and the second electrode 73 may be composed of a reflective electrode, so that the light from the organic light-emitting layer may be emitted to the outside through the first electrode 71.

The capping layer 910 is located on the second electrode 73. The capping layer 910 may serve to increase the light extraction effect in the organic light emitting element. The capping layer 910 may be composed of any one of the material of the first hole transport layer 830, the material of the second hole transporting layer 870, the material of the first electron transporting layer 850, the material of the second electron transporting layer 890, and the host material of each of the first red light emitting layer 840, the second red light-emitting layer 880, the first green light-emitting layer 841, the second green light-emitting layer 881, the first blue light-emitting layer 842, and the second blue light-emitting layer 882, but the embodiments of the present disclosure are not limited thereto. In addition, the capping layer 910 may be omitted.

A display apparatus according to one or more embodiments of the present disclosure may be described as follows.

A display apparatus in accordance with an embodiment of the present disclosure may include a display panel displaying an image; a front member on a front surface of the display panel; a first support member on a rear surface of the display panel; a second support member on a rear surface of the first support member; an optical module positioned on the rear surface of the first support member; and a support body positioned on the rear surface of the first support member and supporting the optical module.

According to at least one embodiment of the present disclosure, the display panel and the first support member may include a first hole. The optical module may be disposed to overlap the first hole According to at least one embodiment of the present disclosure, a width of an outer part of the front member may be smaller than a width of the optical module.

According to at least one embodiment of the present disclosure, the optical module may include a camera module or a sensor.

According to at least one embodiment of the present disclosure, the support body may be formed integrally with the first support member, and may be configured to protrude in a rear direction of the first support member.

According to at least one embodiment of the present disclosure, the display apparatus may further include a fixing member positioned on the rear surface of the first support member, and fixing the optical member.

According to at least one embodiment of the present disclosure, the fixing member may include an adhesive member which attaches the optical module to the rear surface of the first support member, the adhesive member may include a first adhesive member positioned on one side of the first hole; and a second adhesive member positioned on the other side of the first hole, and the support body may include a first portion positioned outside the first adhesive member; a second portion positioned outside the second adhesive member; and a third portion connecting the first portion and the second portion.

According to at least one embodiment of the present disclosure, the third portion may be positioned on an upper side of the first hole.

According to at least one embodiment of the present disclosure, the third portion may be positioned on a lower side of the first hole.

According to at least one embodiment of the present disclosure, the fixing member may include an adhesive member which is positioned on the rear surface of the first support member and attaches the optical module, the adhesive member may include a first adhesive member positioned on one side of the first hole; and a second adhesive member positioned on the other side of the first hole, and the support body may include a first portion positioned outside the first adhesive member; a second portion positioned outside the second adhesive member; and a third portion positioned on an upper side or a lower side of the first hole.

According to at least one embodiment of the present disclosure, the fixing member may include an adhesive member which is positioned on the rear surface of the first support member and attaches the optical module, the adhesive member may include a first adhesive member positioned on one side of the first hole; and a second adhesive member positioned on the other side of the first hole, and the support body may include a first portion positioned outside the first adhesive member, and positioned in a diagonal direction of the first hole; and a second portion positioned outside the second adhesive member, and positioned opposite to the first portion in the diagonal direction of the first hole.

According to at least one embodiment of the present disclosure, the first portion may include a third portion which extends from an outside of the first adhesive member to the upper side of the first hole, and the second portion may include a fourth portion which extends from an outside of the second adhesive member to the lower side of the first hole.

According to at least one embodiment of the present disclosure, the optical module may be accommodated inside the support body by being fixed to the rear surface of the first support member by the fixing member, and the support body may support at least two side surfaces of the optical module.

According to at least one embodiment of the present disclosure, the display panel and the first support member may further include a second hole different from the first hole.

According to at least one embodiment of the present disclosure, the display apparatus may be disposed on a dashboard of a transportation apparatus.

According to at least one embodiment of the present disclosure, the dashboard may include a first area and a second area different from the first area.

According to at least one embodiment of the present disclosure, the first hole may include a first-first hole in the display panel and a first-second hole in the first support member, and a size of the first-first hole and a size of the first-second hole may be different from each other.

According to at least one embodiment of the present disclosure, a transportation apparatus may include an indoor space; and a display apparatus according to any one embodiment of the present disclosure positioned in the indoor space.

According to at least one embodiment of the present disclosure, the indoor space may include a first area corresponding to a driver seat and a second area corresponding to a passenger seat.

According to at least one embodiment of the present disclosure, a size of the first area and a size of the second area may be different from each other.

According to at least one embodiment of the present disclosure, the indoor space may further include a third area between the first area and the second area.

According to at least one embodiment of the present disclosure, the indoor space may further include a fourth area which is positioned on a rear surface of a headrest of any one of the driver seat and the passenger seat.

According to at least one embodiment of the present disclosure, at least one of a size of the first area and a size of the second area may be different from a size of the third area.

Although the example embodiments of the present disclosure have been described in more detail with reference to the accompanying drawings, the present disclosure is not necessarily limited to these embodiments and may be embodied in many different forms without departing from the technical concept of the present disclosure.

Therefore, the example embodiments of the present disclosure are provided for illustrative purposes only but not intended to limit the technical concept of the present disclosure, and the scope of the technical concept of the present disclosure is not limited by these embodiments. Therefore, it should be understood that the above-described example embodiments are illustrative in all aspects and do not limit the present disclosure. The scope of protection of the present disclosure should be interpreted in accordance with the appended claims, and all technical ideas within the scope equivalent thereto should be interpreted as being included in the scope of rights of the present disclosure.

What is claimed is:

1. A display apparatus comprising:
a display panel configured to display an image;
a front member on a front surface of the display panel;
a support member on a rear surface of the display panel that is opposite the front surface of the display panel, a hole in the display panel aligned with a hole in the support member;
an optical module on a rear surface of the support member;
a support body on a portion of the rear surface of the support member and protrudes from the rear surface of the support member, the support body supporting the optical module; and
a fixing member on the rear surface of the support member, the fixing member attaching the optical module to the rear surface of the support member.

2. The display apparatus of claim 1, wherein a width of an outer part of the front member that extends past an edge of the support member is smaller than a width of the optical module.

3. The display apparatus of claim 1, wherein the optical module comprises a camera module or a sensor.

4. The display apparatus of claim 1, wherein the support body is integrated with the support member, and protrudes from the rear surface of the support member in a direction away from the rear surface of the support member.

5. The display apparatus of claim 1, wherein the fixing member comprises an adhesive member that attaches the optical module to the rear surface of the support member, the adhesive member comprising:
a first adhesive member at a first side of the hole in the support member; and
a second adhesive member at a second side of the hole in the support member such that the second adhesive member is spaced apart from the first adhesive member, and
wherein the support body comprises:
a first portion outside the first adhesive member such that the first adhesive member is between the first portion and the hole in the support member in a plan view of the display apparatus;
a second portion outside the second adhesive member such that the second adhesive member is between the second portion and the hole in the support member in the plan view; and
a third portion connecting the first portion and the second portion.

6. The display apparatus of claim 5, wherein the third portion is on an upper side of the hole in the support member and is closer to the upper side of the hole in the support member than a lower side of the hole in the support member.

7. The display apparatus of claim 5, wherein the third portion is on a lower side of the hole in the support member and is closer to the lower side of the hole in the support member than an upper side of the hole in the support member.

8. The display apparatus of claim 1, wherein the fixing member comprises an adhesive member on the rear surface of the support member and attaches the optical module to the rear surface of the support member, wherein the adhesive member comprises:
a first adhesive member at a first side of the hole in the support member; and
a second adhesive member at a second side of the hole in the support member such that the second adhesive member is spaced apart from the first adhesive member, and wherein the support body comprises:
a first portion outside the first adhesive member such that the first adhesive member is between the first portion and the hole in the support member in a plan view of the display apparatus;
a second portion outside the second adhesive member such that the second adhesive member is between the second portion and the hole in the support member in the plan view; and
a third portion on an upper side or a lower side of the hole in the support member that is opposite the upper side in the plan view.

9. The display apparatus of claim 1, wherein the fixing member comprises an adhesive member on the rear surface of the support member and attaches the optical module to the rear surface of the support member, the adhesive member comprising:
a first adhesive member at a first side of the hole in the support member; and
a second adhesive member at a second side of the hole in the support member such that the second adhesive member is spaced apart from the first adhesive member, and wherein the support body comprises:

a first portion outside the first adhesive member, and located in a direction diagonal from the hole in the support member; and a second portion outside the second adhesive member, and located opposite to the first portion in the direction diagonal from the hole in the support member.

10. The display apparatus of claim 9, wherein the first portion includes a third portion that extends from the first portion in a direction towards an upper side of the hole in the support member such that that the first adhesive member is between the first portion and the hole in the support member in a plan view of the display apparatus, and the second portion includes a fourth portion that extends from the second portion in a direction towards a lower side of the hole in the support member such that the second adhesive member is between the second portion and the hole in the support member in the plan view.

11. The display apparatus of claim 1, wherein a portion of the optical module is surrounded by the support body while attached to the rear surface of the support member by the fixing member, and the support body supports at least two side surfaces of the optical module.

12. The display apparatus of claim 1, wherein another hole is formed in the display panel and the support member that is different from the hole.

13. The display apparatus of claim 1, wherein the display apparatus is on a dashboard of a transportation apparatus.

14. The display apparatus of claim 13, wherein the dashboard includes a first area and a second area that is different from the first area.

15. The display apparatus of claim 1, wherein a size of the hole in the display panel is different from a size of the hole in the support member.

16. A transportation apparatus comprising:

an indoor space; and the display apparatus according to claim 1 in the indoor space.

17. The transportation apparatus of claim 16, wherein the indoor space includes a first area corresponding to a driver seat and a second area corresponding to a passenger seat.

18. The transportation apparatus of claim 17, wherein a size of the first area is different from a size of the second area.

19. The transportation apparatus of claim 17, wherein the indoor space further includes a third area between the first area and the second area.

20. The transportation apparatus of claim 19, wherein the indoor space further includes a fourth area on a rear surface of a headrest of any one of the driver seat and the passenger seat.

21. The transportation apparatus of claim 19, wherein at least one of a size of the first area and a size of the second area is different from a size of the third area.

22. A display apparatus comprising:

a display panel configured to display an image in a display area of the display panel, the display panel including a hole through a thickness of the display panel in the display area;

a support member on a rear surface of the display panel, the support member including a hole through a thickness of the support member and the hole aligned with the hole in the display panel;

an optical device on a rear surface of the support member, the optical device including a portion that is disposed within the hole of the support member; and a support body that protrudes from a portion of the rear surface of the support member, the support body surrounding a plurality of surfaces of the optical device that are not disposed within the hole of the support member.

23. The display apparatus of claim 22, wherein the optical device comprises a camera or a sensor.

24. The display apparatus of claim 22, further comprising:

a first adhesive member at a first side of the hole in the support member, the first adhesive member attaching a first portion of the optical device to the rear surface of the support member; and a second adhesive member at a second side of the hole in the support member such that the second adhesive member is spaced apart from the first adhesive member, the second adhesive member attaching a second portion of the optical device to the rear surface of the support member.

25. The display apparatus of claim 24, wherein the support body comprises:

a first portion that extends in a first direction such that the first adhesive member is between the first portion and the hole in the support member in a plan view of the display apparatus; and a second portion that extends in the first direction and spaced apart from the first portion such that the second adhesive member is between the second portion and the hole in the support member in a plan view of the display apparatus.

26. The display apparatus of claim 25, wherein the support body further comprises:

a third portion that extends from an end of the first portion to an end of the second portion in a second direction that is different from the first direction, wherein the third portion is closer to an upper surface of the hole in the support member than a lower surface of the hole in the support member.

27. The display apparatus of claim 25, wherein the support body further comprises:

a third portion that extends from an end of the first portion to an end of the second portion in a second direction that is different from the first direction, wherein the third portion is closer to a lower surface of the hole in the support member than an upper surface of the hole in the support member.

28. The display apparatus of claim 25, wherein the support body further comprises:

a third portion that extends in a second direction toward the first portion and the second portion without contacting the first portion and the second portion, the second direction different from the first direction, wherein the third portion is closer to a lower surface of the hole in the support member than an upper surface of the hole in the support member.

29. The display apparatus of claim 25, wherein the support body further comprises:

a third portion that extends from an end of the first portion in a second direction that is different from the first direction toward the hole in the support member, the third portion closer to an upper surface of the hole in the support member than a lower surface of the hole in the support member in the plan view; and a fourth portion that extends from an end of the second portion in the second direction toward the hole in the support member, the third portion closer to the lower surface of the hole in the support member than the upper surface of the hole in the support member in the plan view.

30. The display apparatus of claim 22, wherein the display apparatus is located in an indoor space of a transportation apparatus.

\* \* \* \* \*